(12) United States Patent
Nakamura et al.

(10) Patent No.: US 12,519,044 B2
(45) Date of Patent: Jan. 6, 2026

(54) SEMICONDUCTOR DEVICE

(71) Applicant: ROHM CO., LTD., Kyoto (JP)

(72) Inventors: Yohei Nakamura, Kyoto (JP); Naotaka Kuroda, Kyoto (JP); Atsushi Yamaguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 611 days.

(21) Appl. No.: 17/918,682

(22) PCT Filed: Apr. 13, 2021

(86) PCT No.: PCT/JP2021/015261
§ 371 (c)(1),
(2) Date: Oct. 13, 2022

(87) PCT Pub. No.: WO2021/215294
PCT Pub. Date: Oct. 28, 2021

(65) Prior Publication Data
US 2023/0090004 A1 Mar. 23, 2023

(30) Foreign Application Priority Data
Apr. 22, 2020 (JP) ................................ 2020-076154

(51) Int. Cl.
*H01L 23/495* (2006.01)
*H01L 23/00* (2006.01)
*H01L 23/31* (2006.01)

(52) U.S. Cl.
CPC .... *H01L 23/49575* (2013.01); *H01L 23/3107* (2013.01); *H01L 23/49562* (2013.01);
(Continued)

(58) Field of Classification Search
None
See application file for complete search history.

(56) References Cited

U.S. PATENT DOCUMENTS

2014/0159054 A1\* 6/2014 Otake ..................... H01L 23/16
257/77
2015/0287665 A1\* 10/2015 Hanada ................... H01L 25/07
257/691
(Continued)

FOREIGN PATENT DOCUMENTS

JP 2009-148077 A 7/2009
WO 2014/208450 A1 12/2014
(Continued)

OTHER PUBLICATIONS

Office Action issued in corresponding Japanese Patent application No. 2022-516970, Jan. 14, 2025, and machine translation (8 pages).
(Continued)

*Primary Examiner* — Sue A Purvis
*Assistant Examiner* — Jordan M Klein
(74) *Attorney, Agent, or Firm* — HSML P.C.

(57) ABSTRACT

Semiconductor device includes: semiconductor elements electrically connected in parallel; pad portion electrically connected to the semiconductor elements; and terminal portion electrically connected to the pad portion. As viewed in thickness direction, the semiconductor elements are aligned along first direction perpendicular to the thickness direction. The pad portion includes closed region surrounded by three line segments each formed by connecting two of first, second and third vertex not disposed on the same straight line. As viewed in thickness direction, the first vertex overlaps with one semiconductor element located in outermost position in first sense of the first direction. As viewed in the thickness direction, the second vertex overlaps with one semiconductor element located in outermost position in second sense of the first direction. As viewed in the thickness direction, the third vertex is located on perpendicular bisector of the line segment connecting the first and second vertex.

18 Claims, 16 Drawing Sheets

(52) U.S. Cl.
CPC .............. *H01L 24/45* (2013.01); *H01L 24/48* (2013.01); *H01L 24/85* (2013.01); *H01L 2224/45124* (2013.01); *H01L 2224/45144* (2013.01); *H01L 2224/45147* (2013.01); *H01L 2224/48247* (2013.01); *H01L 2224/85447* (2013.01); *H01L 2224/8548* (2013.01)

(56) References Cited

U.S. PATENT DOCUMENTS

2016/0079221 A1\* 3/2016 Inokuchi ............... H01L 23/051
 438/123
2020/0083129 A1\* 3/2020 Fujino ............... H01L 23/49531

FOREIGN PATENT DOCUMENTS

WO 2019/187700 A1 10/2019
WO 2020/071185 A1 4/2020

OTHER PUBLICATIONS

International Search Report issued in PCT/JP2021/015261, Jul. 20, 2021 (2 pages).

\* cited by examiner

SEMICONDUCTOR DEVICE

TECHNICAL FIELD

The present disclosure relates to a semiconductor device.

BACKGROUND ART

Conventionally, a semiconductor device including a power semiconductor element, such as a metal oxide semiconductor field effect transistor (MOSFET) or an insulated gate bipolar transistor (IGBT), has been known. In such a semiconductor device, a plurality of semiconductor elements may be connected in parallel for use to achieve larger capacity and higher output (e.g., Patent document 1). The semiconductor device disclosed in Patent document 1 includes two semiconductor elements, a first terminal, a second terminal, a first connecting conductor, a second connecting conductor, and a wire. In Patent document 1, the two semiconductor elements are IGBTs. The two semiconductor elements are mounted on the first connecting conductor, and collector electrodes of the two semiconductor elements are electrically connected to the first connecting conductor. The first connecting conductor is connected to the first terminal. The first terminal is a collector terminal, for example. Wires are bonded to emitter electrodes of the two semiconductor elements, so that the two semiconductor elements are electrically connected to the second connecting conductor via the wires. The second connecting conductor is connected to the second terminal. The second terminal is an emitter terminal, for example.

PRIOR ART DOCUMENT

Patent Document

Patent Document 1: JP-A-2009-148077

SUMMARY OF THE INVENTION

Problem to be Solved by the Invention

In the semiconductor device disclosed in Patent document 1, there is a difference in distance between the current paths from the first terminal to the respective semiconductor elements, for example. Due to the difference in distance, there is a possibility of deviation in the magnitude of a current flowing through each of the semiconductor elements. The deviation can increase the load on one of the semiconductor elements and shorten the life of the semiconductor element relative to the other semiconductor element.

In view of the above circumstances, an object of the present disclosure is to provide a semiconductor device capable of suppressing the deviation in currents flowing through a plurality of semiconductor elements connected in parallel.

Means to Solve the Problem

A semiconductor device according to the present disclosure includes: a plurality of first semiconductor elements each having a first element obverse surface and a first element reverse surface that are spaced apart from each other in a thickness direction, the plurality of first semiconductor elements being electrically connected to each other in parallel; a pad portion electrically connected to the plurality of first semiconductor elements; and a first terminal portion electrically connected to the pad portion. As viewed in the thickness direction, the plurality of first semiconductor elements are aligned along a first direction perpendicular to the thickness direction. The pad portion includes a closed region surrounded by three line segments that are each formed by connecting two of a first vertex, a second vertex, and a third vertex that are not on the same straight line. As viewed in the thickness direction, the first vertex overlaps with one of the plurality of first semiconductor elements that is located in an outermost position in a first sense of the first direction. As viewed in the thickness direction, the second vertex overlaps with one of the plurality of first semiconductor elements that is located in an outermost position in a second sense of the first direction. As viewed in the thickness direction, the third vertex is located on a perpendicular bisector of the line segment connecting the first vertex and the second vertex.

Advantages of the Invention

The semiconductor device of the present disclosure can suppress the difference in the current flowing through each of the plurality of semiconductor elements connected in parallel.

MODE FOR CARRYING OUT THE INVENTION

Figure 1:
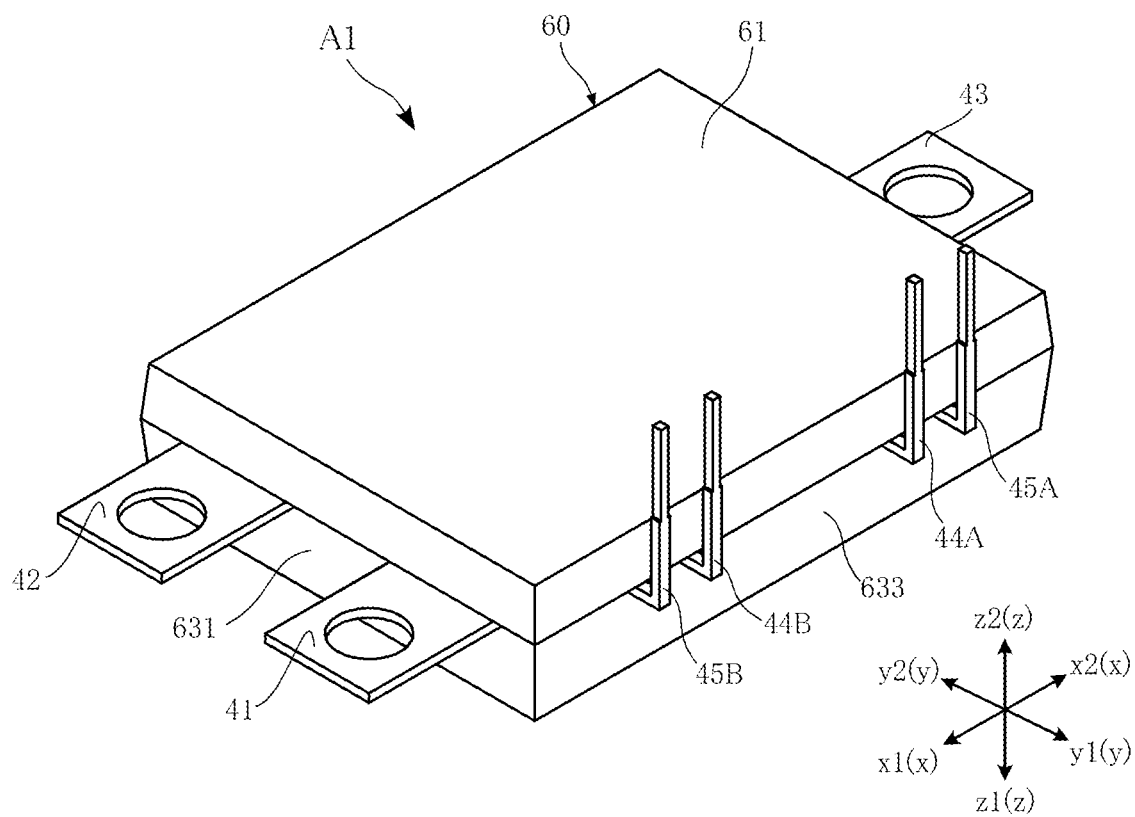
FIG. 1 is a perspective view showing a semiconductor device according to a first embodiment.

Preferred embodiments of a semiconductor device according to the present disclosure are described below with reference to the drawings. In the following description, identical or similar elements are provided with the same reference signs, and redundant descriptions are omitted.

FIGS. 1 to 10 show a semiconductor device A1 according to a first embodiment. The semiconductor device A1 includes a plurality of semiconductor elements 10 and 20, a support substrate 30, a plurality of terminals, a plurality of connecting members, and a resin member 60. The terminals include two input terminals 41 and 42, an output terminal 43, a pair of control terminals 44A and 44B, and a pair of detection terminals 45A and 45B. The connecting members include a plurality of gate wires 51, a plurality of detection wires 52, a pair of first connecting wires 53, a pair of second connecting wires 54, and a plurality of lead plates 55.

Figure 2:
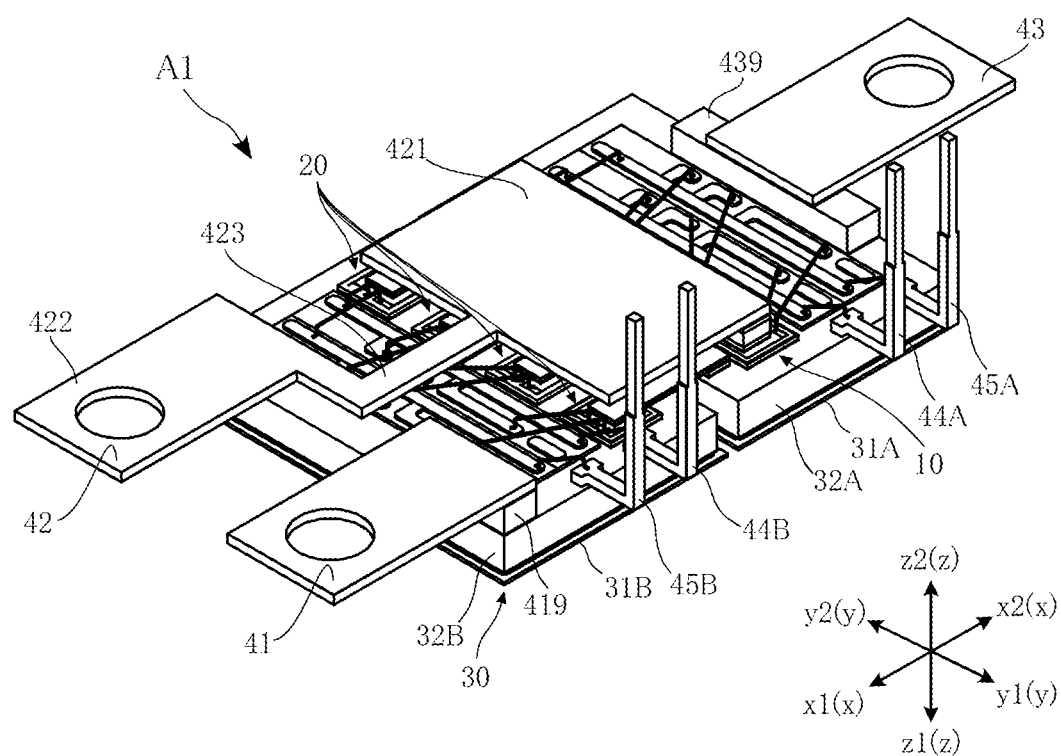
FIG. 2 is a perspective view corresponding to FIG. 1 but omitting a resin member.
Figure 3:
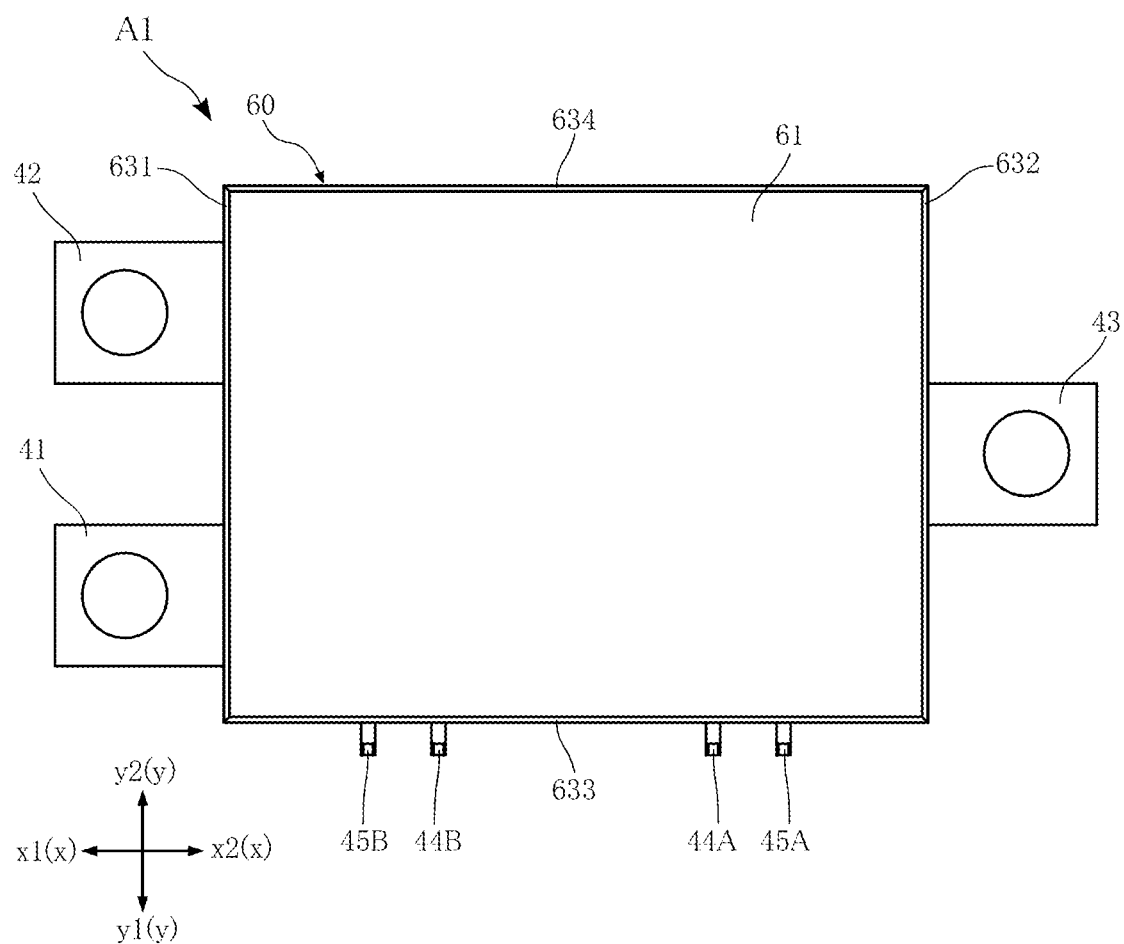
FIG. 3 is a plan view showing the semiconductor device according to the first embodiment.
Figure 4:
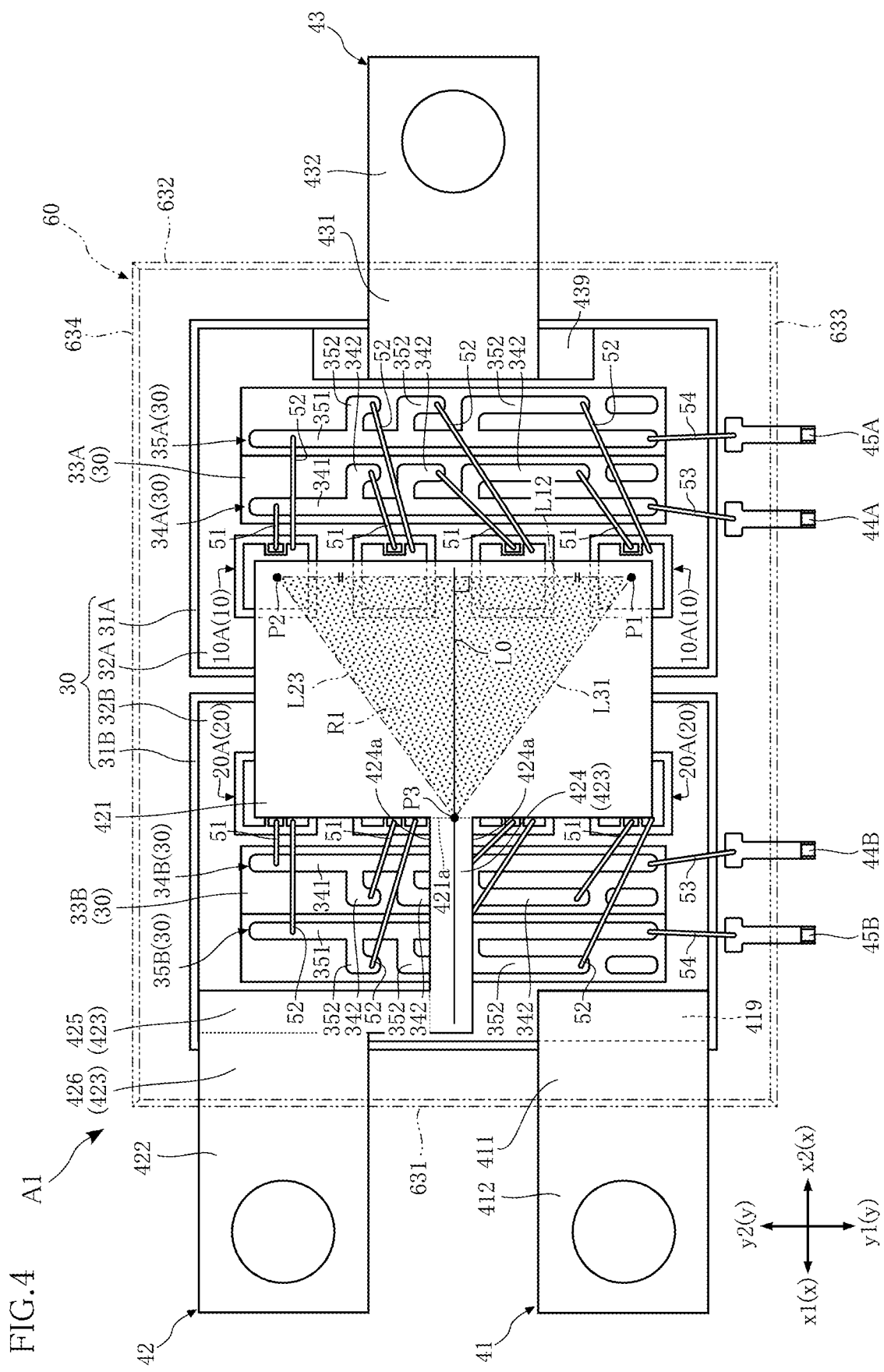
FIG. 4 is a plan view corresponding to FIG. 3, with the resin member indicated by an imaginary line.
Figure 5:
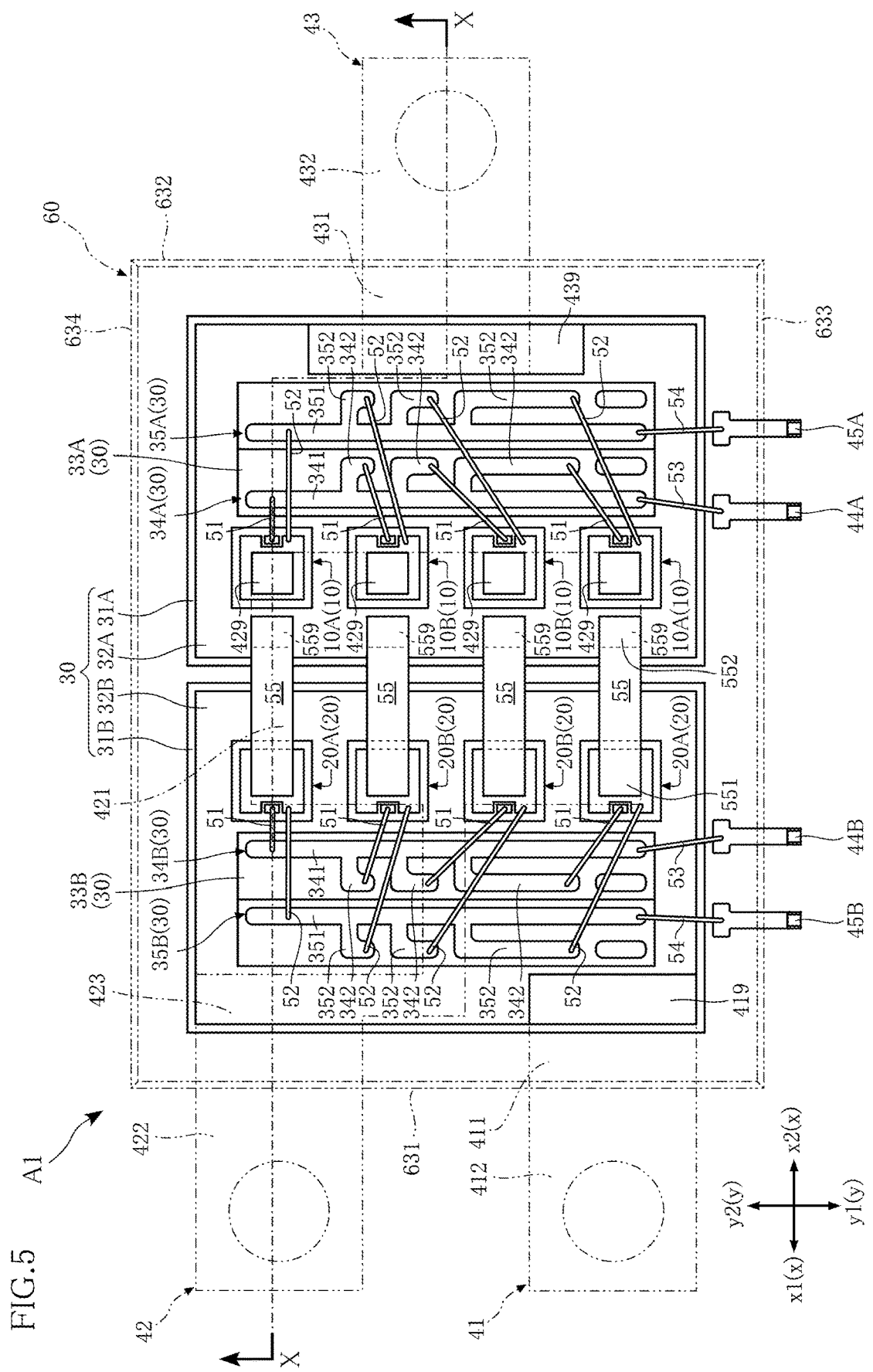
FIG. 5 is a plan view corresponding to FIG. 4, with two input terminals and an output terminal indicated by imaginary lines.
Figure 6:
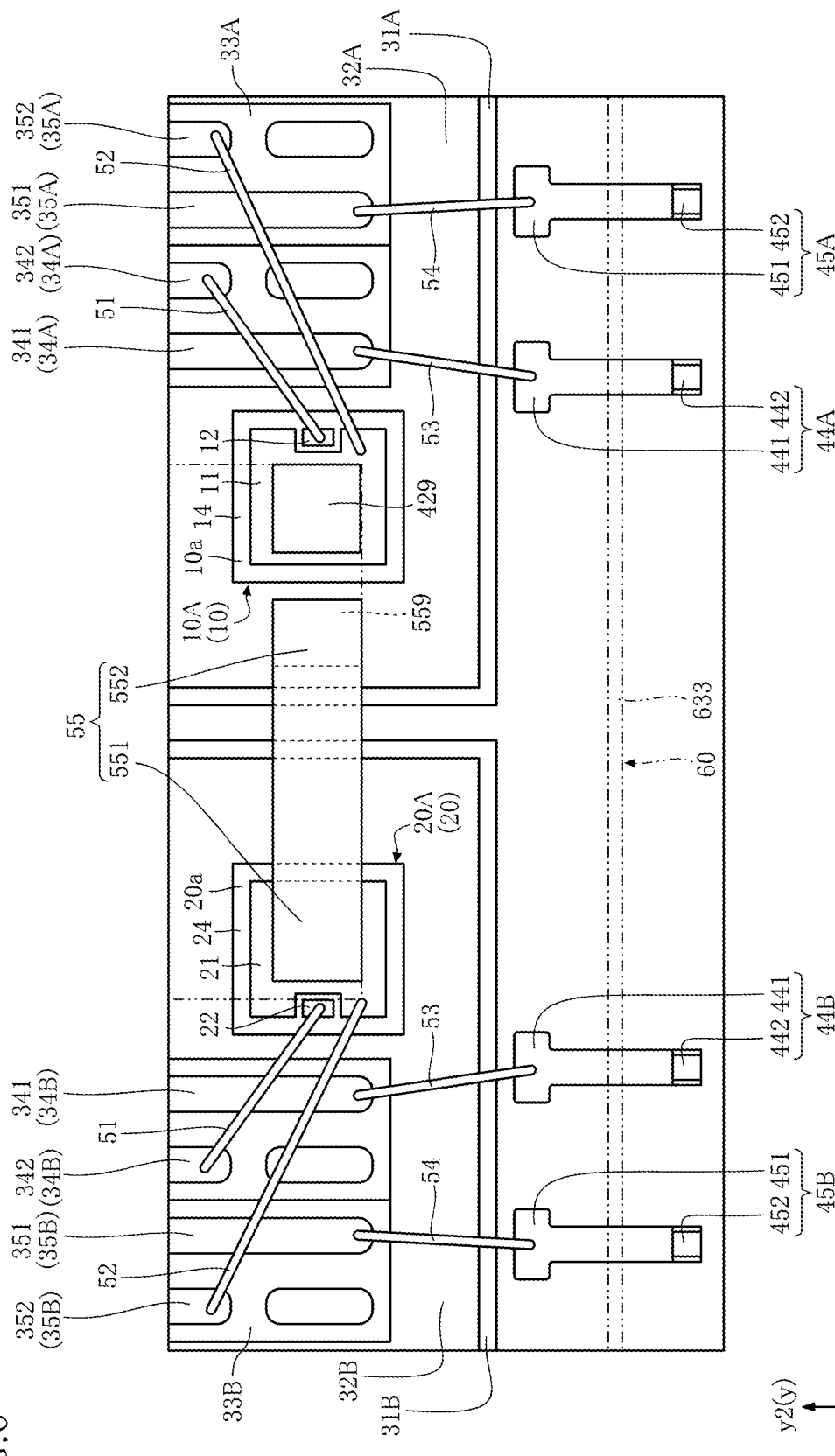
FIG. 6 is a partially enlarged view showing a part of FIG. 5.
Figure 7:
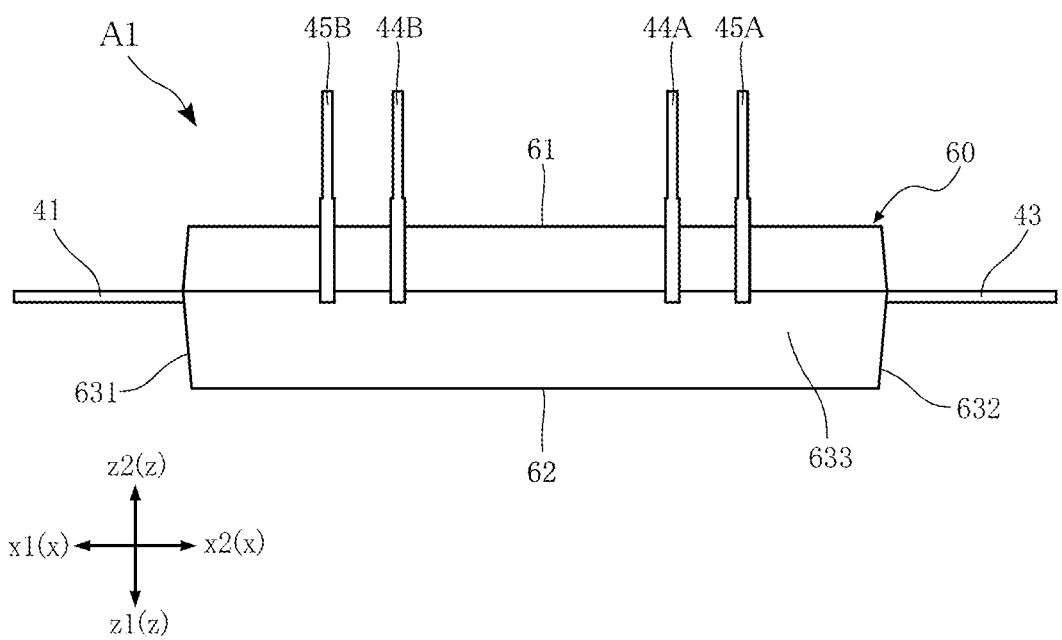
FIG. 7 is a front view showing the semiconductor device according to the first embodiment.
Figure 8:
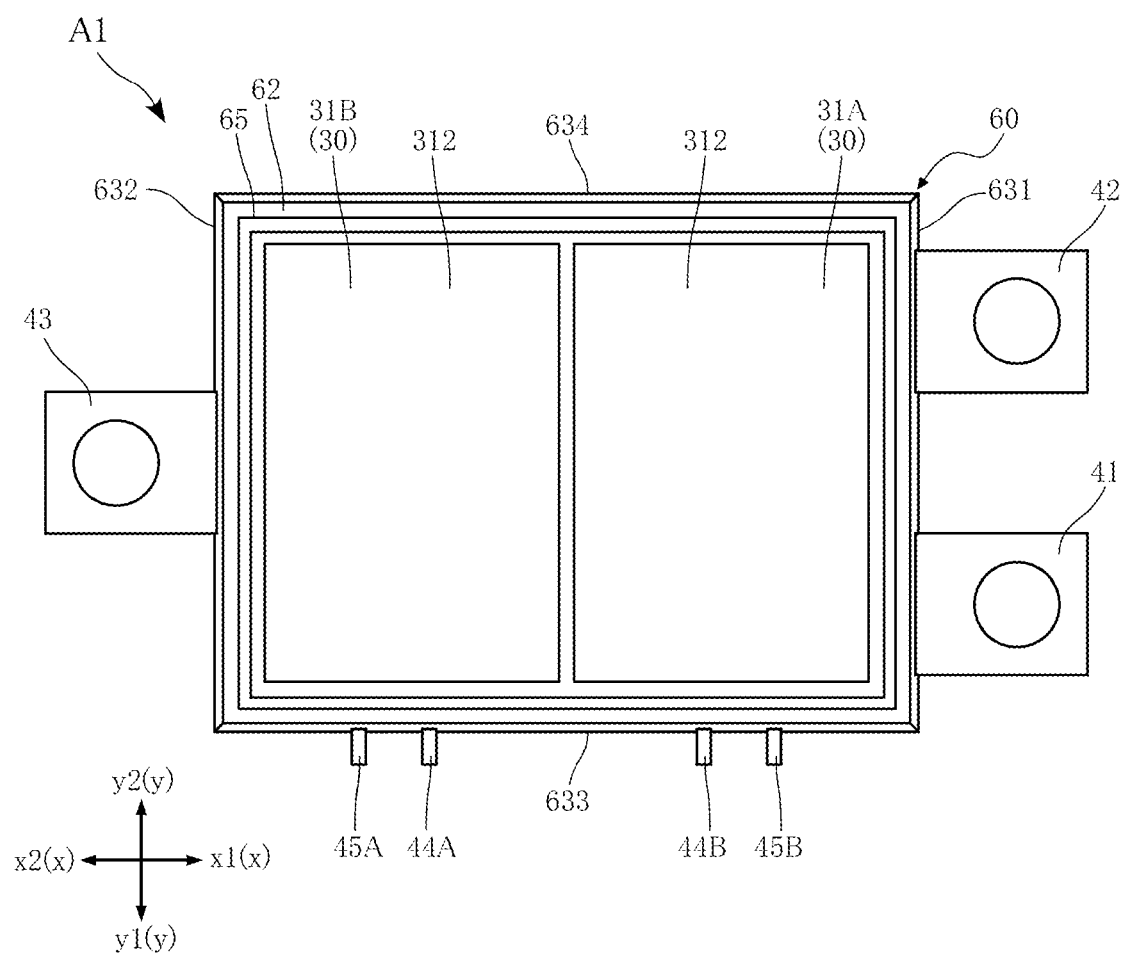
FIG. 8 is a bottom view showing the semiconductor device according to the first embodiment.
Figure 9:
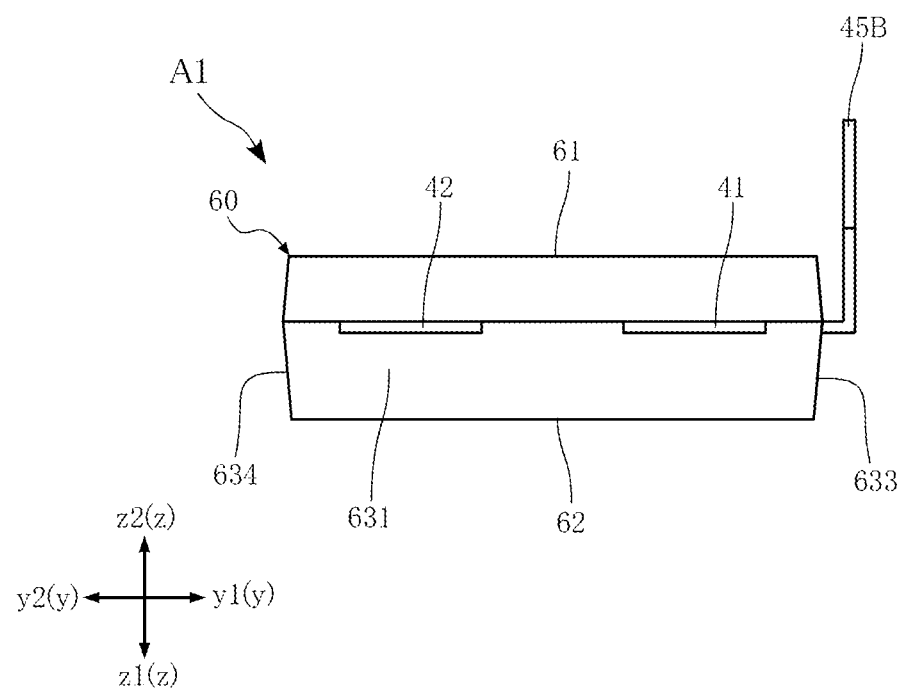
FIG. 9 is a left side view showing the semiconductor device according to the first embodiment.
Figure 10:
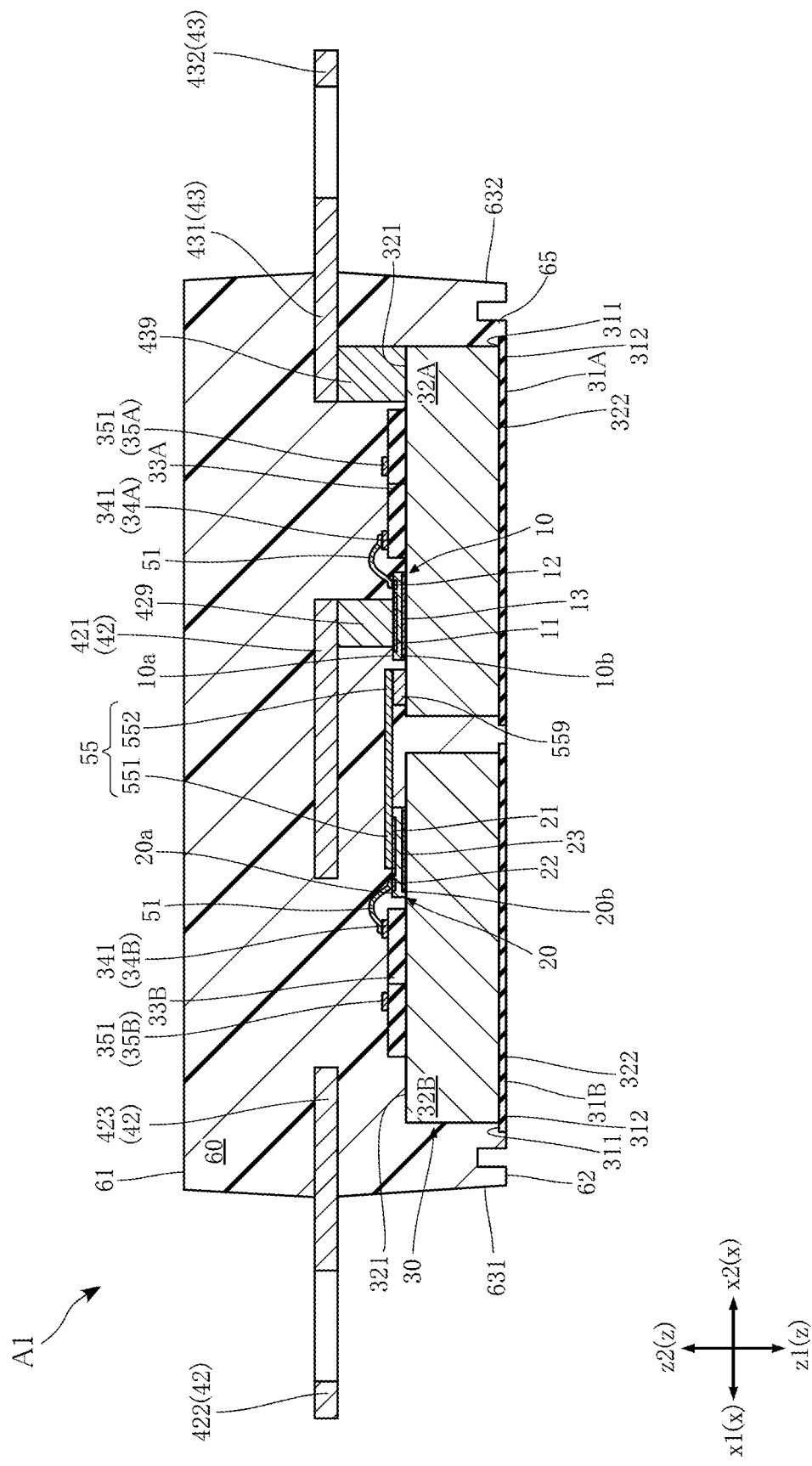
FIG. 10 is a cross-sectional view along line X-X in FIG. 5.

FIG. 1 is a perspective view showing the semiconductor device A1. FIG. 2 is a perspective view corresponding to FIG. 1 but omitting the resin member 60. FIG. 3 is a plan view showing the semiconductor device A1. FIG. 4 is a plan view corresponding to FIG. 3, with the resin member 60 indicated by an imaginary line (two-dot chain line). FIG. 5 is a plan view corresponding to FIG. 4, with the two input terminals 41 and 42 and the output terminal 43 indicated by imaginary lines. FIG. 6 is a partially enlarged view showing a part of FIG. 5. FIG. 7 is a front view showing the semiconductor device A1. FIG. 8 is a bottom view showing the semiconductor device A1. FIG. 9 is a side view (left side view) showing the semiconductor device A1. FIG. 10 is a cross-sectional view along line X-X in FIG. 5.

For convenience, reference is made to three mutually perpendicular directions (i.e., x direction, y direction, and z direction) as appropriate. The z direction is the thickness direction of the semiconductor device A1. The x direction is the horizontal direction in the plan view (see FIG. 3) of the semiconductor device A1. The y direction is the vertical direction in the plan view (see FIG. 3) of the semiconductor device A1. One sense of the x direction is referred to as x1 direction, and the other sense as x2 direction. Similarly, one sense of the y direction is referred to as y1 direction, and the other sense as y2 direction. One sense of the z direction is referred to as z1 direction, and the other sense as z2 direction. In the following description, a "plan view" is a view seen in the z direction. The z direction is an example of the "thickness direction", the x direction is an example of a "second direction", and the y direction is an example of a "first direction".

The semiconductor elements 10 and 20 are made of a semiconductor material that mainly contains silicon carbide (SiC), for example. The semiconductor material is not limited to SiC, and may be silicon (Si), gallium arsenide (GaAs), or gallium nitride (GaN). It is preferable to use a wideband gap semiconductor material as the semiconductor material. Each of the semiconductor elements 10 and 20 is a MOSFET, for example. Each of the semiconductor elements 10 and 20 is not limited to a MOSFET, and may be another transistor, which is, for example, a field-effect transistor such as a metal-insulator-semiconductor FET or a bipolar transistor such as an IGBT. The semiconductor elements 10 and 20 are the same elements, and may be n-channel MOSFETs, for example. Each of the semiconductor elements 10 and 20 has, but not limited to, a rectangular shape in plan view.

For example, the semiconductor device A1 includes four semiconductor elements 10 and four semiconductor elements 20. The number of the semiconductor elements 10 and 20 is not limited to the above, and may be changed according to the performance required for the semiconductor device A1. The semiconductor device A1 may be a half-bridge switching circuit. In this case, the semiconductor elements 10 constitute an upper arm circuit of the semiconductor device A1, and the semiconductor elements 20 constitute a lower arm circuit of the semiconductor device A1. According to the configuration described below, the semiconductor elements 10 are electrically connected in parallel, and the semiconductor elements 20 are electrically connected in parallel. The semiconductor elements 10 and the semiconductor elements 20 are connected in series to form bridges.

As shown in FIG. 10, each of the semiconductor elements 10 has an element obverse surface 10a and an element reverse surface 10b. The element obverse surface 10a and the element reverse surface 10b of each semiconductor element 10 are spaced apart from each other in the z direction. The element obverse surface 10a faces in the z2 direction, and the element reverse surface 10b faces in the z1 direction. The element obverse surface 10a is an example of a "first element obverse surface", and the element reverse surface 10b is an example of a "first element reverse surface".

Each of the semiconductor elements 10 includes an obverse surface electrode 11, a control electrode 12, a reverse surface electrode 13, and an insulating film 14. As shown in FIGS. 6 and 10, the obverse surface electrode 11 and the control electrode 12 are provided on the element obverse surface 10a. The obverse surface electrode 11 may be a source electrode through which a source current flows. The control electrode 12 may be a gate electrode to which a gate voltage for driving the semiconductor element 10 is applied. In plan view, the obverse surface electrode 11 is larger than the control electrode 12. In the example shown in FIG. 6, the obverse surface electrode 11 is configured with a single region. However, the obverse surface electrode 11 may be divided into multiple regions. As shown in FIG. 10, the reverse surface electrode 13 is provided on the element reverse surface 10b. The reverse surface electrode 13 may be a drain electrode through which a drain current flows. The reverse surface electrode 13 is formed across substantially the entirety of the element reverse surface 10b. As shown in FIGS. 6 and 10, the insulating film 14 is provided on the element obverse surface 10a. The insulating film 14 is electrically insulative. The insulating film 14 surrounds the obverse surface electrode 11 and the control electrode 12 in plan view, and insulates the obverse surface electrode 11 and the control electrode 12 from each other. The insulating film 14 may be formed by stacking a silicon dioxide ($SiO_2$) layer, a silicon nitride ($SiN_4$) layer, and a polybenzoxazole layer in this order, with the polybenzoxazole layer being the surface layer of the semiconductor element 10. The configuration of the insulating film 14 is not limited to the one described above. For example, it is possible to stack a polyimide layer in place of the polybenzoxazole layer.

Each of the semiconductor elements 10 switches between a conductive state and a non-conductive state according to a first drive signal (e.g., gate voltage) inputted to the control electrode 12 (gate electrode). The operation of switching between the conductive state and the non-conductive state is referred to as a switching operation. In the conductive state, a current flows from the reverse surface electrode 13 (drain electrode) to the obverse surface electrode 11 (source electrode). In the non-conductive state, the drain-to-source current does not flow.

As shown particularly in FIGS. 5, 6, and 10, the semiconductor elements 10 are mounted on the support substrate 30. In the example shown in FIG. 5, the semiconductor elements 10 are arranged along the y direction and spaced apart from each other. The semiconductor elements 10 are electrically bonded to the support substrate 30 (conductive substrate 32A described below) via a non-illustrated conductive bonding member (e.g., sintered metal such as sintered silver or sintered copper, metal paste material such as silver or copper, or solder). The semiconductor elements 10 are bonded to the conductive substrate 32A with the element reverse surfaces 10b facing the conductive substrate 32A. The semiconductor elements 10 are an example of "first semiconductor elements". In each of the semiconductor elements 10, the obverse surface electrode 11 is an example of a "first obverse surface electrode", the control electrode 12 is an example of a "first control electrode", and the reverse surface electrode 13 is an example of a "first reverse surface electrode".

As shown in FIG. 5, the semiconductor elements 10 include two outer elements 10A and a plurality of inner elements 10B. The two outer elements 10A are outermost ones of the semiconductor elements 10 in the y direction. The inner elements 10B are some of the semiconductor elements 10 sandwiched between the two outer elements 10A in the y direction. Since the semiconductor device A1 according to the present embodiment includes four semiconductor elements 10, the number of inner elements 10B is two. In a configuration different from the semiconductor device A1, the number of inner elements 10B may change. In one example where the number of semiconductor elements 10 is two, there is no inner element 10B. In another example where the number of semiconductor elements is three, the number of inner elements 10B is one.

As shown in FIG. 10, each of the semiconductor elements 20 has an element obverse surface 20a and an element reverse surface 20b. The element obverse surface 20a and the element reverse surface 20b of each semiconductor element 20 are spaced apart from each other in the z direction. The element obverse surface 20a faces in the z2 direction, and the element reverse surface 20b faces in the z1 direction. The element obverse surface 20a is an example of a "second element obverse surface", and the element reverse surface 20b is an example of a "second element reverse surface".

Each of the semiconductor elements 20 includes an obverse surface electrode 21, a control electrode 22, a reverse surface electrode 23, and an insulating film 24. As shown in FIGS. 6 and 10, the obverse surface electrode 21 and the control electrode 22 are provided on the element obverse surface 20a. The obverse surface electrode 21 may be a source electrode through which a source current flows. The control electrode 22 may be a gate electrode to which a gate voltage for driving the semiconductor element 20 is applied. In plan view, the obverse surface electrode 21 is larger than the control electrode 22. In the example shown in FIG. 6, the obverse surface electrode 21 is configured with a single region. However, the obverse surface electrode 21 may be divided into multiple regions. As shown in FIG. 10, the reverse surface electrode 23 is provided on the element reverse surface 20b. The reverse surface electrode 23 may be a drain electrode through which a drain current flows. The reverse surface electrode 23 is formed across substantially the entirety of the element reverse surface 20b. As shown in FIGS. 6 and 20, the insulating film 24 is provided on the element obverse surface 20a. The insulating film 24 is electrically insulative. The insulating film 24 surrounds the obverse surface electrode 21 and the control electrode 22 in plan view. The insulating film 24 insulates the obverse surface electrode 21 and the control electrode 22 from each other on the element obverse surface 20a. The insulating film 24 may be made of the same material as the insulating film 14.

Each of the semiconductor elements 20 switches between a conductive state and a non-conductive state according to a second drive signal (e.g., gate voltage) inputted to the control electrode 22 (gate electrode). In the conductive state, a current flows from the reverse surface electrode 23 (drain electrode) to the obverse surface electrode 21 (source electrode). In the non-conductive state, the drain-to-source current does not flow.

As shown particularly in FIGS. 5, 6, and 10, the semiconductor elements 20 are mounted on the support substrate 30. In the example shown in FIG. 5, the semiconductor elements 20 are arranged along the y direction and spaced apart from each other. The semiconductor elements 20 overlap with the semiconductor elements 10 as viewed in the x direction. The semiconductor elements 20 are electrically bonded to the support substrate 30 (conductive substrate 32B described below) via a non-illustrated conductive bonding member (e.g., sintered metal such as sintered silver or sintered copper, metal paste material such as silver or copper, or solder). The semiconductor elements 20 are bonded to the conductive substrate 32B with the element reverse surfaces 20b facing the conductive substrate 32B. The semiconductor elements 20 are an example of "second semiconductor elements". In each of the semiconductor elements 20, the obverse surface electrode 21 is an example of a "second obverse surface electrode", the control electrode 22 is an example of a "second control electrode", and the reverse surface electrode 23 is an example of a "second reverse surface electrode".

As shown in FIG. 5, the semiconductor elements 20 include two outer elements 20A and a plurality of inner elements 20B. The two outer elements 20A are outermost ones of the semiconductor elements 20 in the y direction. The inner elements 20B are some of the semiconductor elements 20 sandwiched between the two outer elements 20A in the y direction. Since the semiconductor device A1 according to the present embodiment includes four semiconductor elements 20, the number of inner elements 20B is two. In a configuration different from the semiconductor device A1, the number of inner elements 20B may change. In one example where the number of semiconductor elements 20 is two, there is no inner element 20B. In another example where the number of semiconductor elements is three, the number of inner elements 20B is one.

The support substrate 30 supports the semiconductor elements 10 and 20. The support substrate 30 includes a pair of insulating substrates 31A and 31B, a pair of conductive substrates 32A and 32B, a pair of insulating layers 33A and 33B, a pair of gate layers 34A and 34B, and a pair of detection layers 35A and 35B.

The pair of insulating substrates 31A and 31B are electrically insulative. Each of the insulating substrates 31A and 31B is made of a ceramic material having excellent thermal conductivity, for example. The ceramic material is aluminum nitride (AlN), for example. Each of the insulating substrates 31A and 31B is not limited to a ceramic material, and may be an insulating resin sheet. Each of the insulating substrates 31A and 31B has a rectangular shape in plan view, for example. As shown particularly in FIGS. 5 and 10, the insulating substrates 31A and 31B are aligned in the x direction and spaced apart from each other. The insulating substrate 31A is offset in the x2 direction relative to the insulating substrate 31B.

As shown particularly in FIG. 10, each of the insulating substrates 31A and 31B has an obverse surface 311 and a reverse surface 312. The obverse surface 311 and the reverse surface 312 of each of the insulating substrates 31A and 31B are spaced apart from each other in the z direction. The obverse surface 311 faces in the z2 direction, and the reverse surface 312 faces in the z1 direction. The obverse surface 311 is covered with the resin member 60, together with the pair of conductive substrates 32A and 32B and the semiconductor elements 10 and 20. As shown in FIG. 8, the reverse surface 312 is exposed from the resin member 60 (resin reverse surface 62 described below). The reverse surface 312 is connected to a heat sink (not illustrated), for example.

Each of the conductive substrates 32A and 32B is a plate-like member made of metal. The metal is copper (Cu) or a Cu alloy, for example. Each of the pair of conductive substrates 32A and 32B is not limited to being made of metal, and may be made of graphite and metal layers (e.g., Cu or Al) formed on the respective surfaces of the graphite layer in the thickness direction (z direction). The conductive substrates 32A and 32B constitute a conductive path to the semiconductor elements 10 and 20, together with the two input terminals 41 and 42 and the output terminal 43. The surfaces of the conductive substrates 32A and 32B in the z2 direction may be provided with plating. As shown particularly in FIGS. 5 and 10, the conductive substrates 32A and 32B are spaced apart from each other in the x direction. In the example shown in FIGS. 5 and 10, the conductive substrate 32A is offset in the x2 direction relative to the conductive substrate 32B.

As shown particularly in FIG. 10, each of the conductive substrates 32A and 32B has an obverse surface 321 and a reverse surface 322. The obverse surface 321 and the reverse surface 322 of each of the conductive substrates 32A and 32B are spaced apart from each other in the z direction. The obverse surface 321 faces in the z2 direction, and the reverse surface 322 faces in the z1 direction.

As shown particularly in FIG. 10, the conductive substrate 32A is bonded to the insulating substrate 31A via a bonding member (not illustrated). The bonding member may be either conductive or insulative. When the conductive substrate 32A is bonded to the insulating substrate 31A, the reverse surface 322 of the conductive substrate 32A faces the obverse surface 311 of the insulating substrate 31A. The semiconductor elements 10 are mounted on the obverse surface 321 of the conductive substrate 32A. Each of the semiconductor elements 10 is bonded to the conductive substrate 32A via a conductive bonding member, and the reverse surface electrode 13 (drain electrode) of each of the semiconductor elements 10 is electrically connected to the conductive substrate 32A. In the present embodiment, the conductive substrate 32A is an example of a "first conductive member".

As shown particularly in FIG. 10, the conductive substrate 32B is bonded to the insulating substrate 31B via a bonding member (not illustrated). The bonding member may be either conductive or insulative. When the conductive substrate 32B is bonded to the insulating substrate 31B, the reverse surface 322 of the conductive substrate 32B faces the obverse surface 311 of the insulating substrate 31B. The semiconductor elements 20 are mounted on the obverse surface 321 of the conductive substrate 32B. Each of the semiconductor elements 20 is bonded to the conductive substrate 32B via a conductive bonding member, and the reverse surface electrode 13 (drain electrode) of each of the semiconductor elements 20 is electrically connected to the conductive substrate 32B. In the present embodiment, the conductive substrate 32B is an example of a "second conductive member".

The pair of insulating layers 33A and 33B are electrically insulative, and are made of glass epoxy resin. As shown in FIG. 5, each of the pair of insulating layers 33A and 33B has a band shape extending in the y direction. As shown in FIGS. 5 and 10, the insulating layer 33A is bonded to the obverse surface 321 of the conductive substrate 32A. The insulating layer 33A is offset in the x2 direction relative to the semiconductor elements 10. As shown in FIGS. 5 and 10, the insulating layer 33B is bonded to the obverse surface 321 of the conductive substrate 32B. The insulating layer 33B is offset in the x1 direction relative to the semiconductor elements 20. The insulating layer 33A insulates the conductive substrate 32A from the gate layer 34A and the detection layer 35A, and the insulating layer 33B insulates the conductive substrate 32B from the gate layer 34B and the detection layer 35B.

The pair of gate layers 34A and 34B are electrically conductive and made of, for example, copper or a copper alloy. As shown particularly in FIG. 5, each of the gate layers 34A and 34B includes a band-shaped portion 341 and hook-shaped portions 342. The band-shaped portion 341 has a band shape in plan view and extends in the y direction. The hook-shaped portions 342 protrude from the band-shaped portion 341. Each of the gate layers 34A and 34B may be made of only the band-shaped portion 341 without the hook-shaped portions 342. As shown in FIGS. 5 and 10, the gate layer 34A is provided on the insulating layer 33A. Some of the gate wires 51 are bonded to the gate layer 34A, so that the gate layer 34A is electrically connected to the control electrodes 12 (gate electrodes) of the semiconductor elements 10 via the gate wires 51. As shown in FIGS. 5 and 10, the gate layer 34B is provided on the insulating layer 33B. Some of the gate wires 51 are bonded to the gate layer 34B, so that the gate layer 34B is electrically connected to the control electrodes 22 (gate electrodes) of the semiconductor elements 20 via the gate wires 51.

The pair of detection layers 35A and 35B are electrically conductive and made of, for example, copper or a copper alloy. As shown particularly in FIG. 5, each of the detection layers 35A and 35B includes a band-shaped portion 351 and hook-shaped portions 352. The band-shaped portion 351 has a band shape in plan view and extends in the y direction. The hook-shaped portions 352 protrude from the band-shaped portion 351. Each of the detection layers 35A and 35B may be made of only the band-shaped portion 351 without the hook-shaped portions 352. As shown in FIGS. 5 and 10, the detection layer 35A is provided on the insulating layer 33A, together with the gate layer 34A. Some of the detection wires 52 are bonded to the detection layer 35A, so that the detection layer 35A is electrically connected to the obverse surface electrodes 11 (source electrodes) of the semiconductor elements 10 via the detection wires 52. As shown in FIGS. 5 and 10, the detection layer 35B is provided on the insulating layer 33B, together with the gate layer 34B. Some of the detection wires 52 are bonded to the detection layer 35B, so that the detection layer 35B is electrically connected to the obverse surface electrodes 21 (source electrodes) of the semiconductor elements 20 via the detection wires 52.

As shown in FIGS. 5 and 10, the gate layer 34A and the detection layer 35A are aligned in the x direction on the insulating layer 33A, and are spaced apart from each other. In the example shown in FIGS. 5 and 10, the gate layer 34A is closer to the semiconductor elements 10 than the detection layer 35A in the x direction. In other words, the gate layer 34A is offset in the x1 direction relative to the detection layer 35A. Note that the positions of the gate layer 34A and the detection layer 35A in the x direction may be switched around. As shown in FIGS. 5 and 10, the gate layer 34B and the detection layer 35B are aligned in the x direction on the insulating layer 33B, and are spaced apart from each other. In the example shown in FIGS. 5 and 10, the gate layer 34B is closer to the semiconductor elements 20 than the detection layer 35B in the x direction. In other words, the gate layer 34B is offset in the x2 direction relative to the detection layer 35B. Note that the positions of the gate layer 34B and the detection layer 35B in the x direction may be switched around.

The configuration of the support substrate 30 is not limited to the example given above. For example, the two conductive substrates 32A and 32B may be bonded to a single insulating substrate. In other words, the pair of insulating substrates 31A and 31B may be formed integrally rather than being divided. Furthermore, in order to improve the bonding strength with the heat sink, a metal layer may be formed on the reverse surface 312 of each of the insulating substrates 31A and 31B. It is also possible to appropriately modify the shape, size, arrangement, etc., of each of the insulating substrates 31A and 31B and the conductive substrates 32A and 32B, based on the number of semiconductor elements 10 and 20 and the arrangement thereof, for example.

The terminals are external terminals used when the semiconductor device A1 is mounted on the circuit board of an electronic device or the like. The terminals include the two input terminals 41 and 42, the output terminal 43, the pair of control terminals 44A and 44B, and the pair of detection terminals 45A and 45B. Each of the terminals is made of a metal plate. The metal plate is made of Cu or a Cu alloy. Each of the terminals is made of a material having a lower electrical conductivity than each of the conductive substrates 32A and 32B. In other words, the electrical resistivity of each of the terminals is larger than the electrical resistivity of each of the conductive substrates 32A and 32B. The terminals are formed from the same lead frame, for example.

Source voltage is applied to the two input terminals 41 and 42. For example, the input terminal 41 is a positive terminal (P terminal), and the input terminal 42 is a negative terminal (N terminal). As shown particularly in FIGS. 1 to 4, the two input terminals 41 and 42 are offset in the x1 direction in the semiconductor device A1. The two input terminals 41 and 42 are spaced apart from each other.

As shown particularly in FIG. 4, the input terminal 41 includes a pad portion 411 and a terminal portion 412.

The pad portion 411 is covered with the resin member 60. As shown in FIGS. 2, 4, 5, and 10, the pad portion 411 is electrically bonded to the conductive substrate 32B via a conductive block member 419. The material of the block member 419 is not particularly limited, but may be Cu, a Cu alloy, a composite of copper molybdenum (CuMo) or a composite of copper-inver-copper (CIC). The pad portion 411 is bonded to the block member 419, and the block member 419 is bonded to the conductive substrate 32B. Bonding between the pad portion 411 and the block member 419, and bonding between the block member 419 and the conductive substrate 32B may be achieved by any of bonding with a conductive bonding member, laser bonding, or ultrasonic bonding. In the configuration described above, the bonding between the pad portion 411 and the conductive substrate 32B is achieved via the block member 419. However, in an alternative example, the pad portion 411 may be partially bent so that the pad portion 411 is directly bonded to the conductive substrate 32B.

The terminal portion 412 is exposed from the resin member 60. As shown particularly in FIG. 4, the terminal portion 412 extends from the resin member 60 in the x1 direction in plan view. The terminal portion 412 has a rectangular shape in plan view, for example. As shown in FIGS. 4 and 5, the terminal portion 412 is offset in the y1 direction relative to the center of the resin member 60 in the y direction. The terminal portion 412 is an example of a "second terminal portion".

As shown particularly in FIG. 4, the input terminal 42 includes a pad portion 421, a terminal portion 422, and a joining portion 423. The pad portion 421, the terminal portion 422, and the joining portion 423 each have a plate-like shape, and are formed integrally.

The pad portion 421 is covered with the resin member 60. With the pad portion 421 covered with the resin member 60, the input terminal 42 is supported by the resin member 60. As shown in FIGS. 5, 6, and 10, the pad portion 421 is electrically bonded to the obverse surface electrodes 11 of the semiconductor elements 10 via conductive block members 429. As with the block member 419, the block members 429 may be made of Cu, a Cu alloy, a composite of CuMo, or a composite of CIC, but the material of the block members 429 is not limited to these examples. The pad portion 421 is bonded to the block members 429, and the block members 429 are bonded to the obverse surface electrodes 11 of the semiconductor elements 10. Bonding between the pad portion 421 and the block members 429 may be achieved by any of bonding with a conductive bonding member, laser bonding, or ultrasonic bonding. Bonding between the block members 429 and the obverse surface electrodes 11 of the semiconductor elements 10 may be achieved with a conductive bonding member (e.g., solder, metal paste, or sintered metal). The pad portion 421 has a rectangular shape in plan view, for example. The edges of the pad portion 421 along the x direction overlap with the outer elements 10A and 20A in plan view. The pad portion 421 extends across the conductive substrate 32A and the conductive substrate 32B in plan view. As shown in FIG. 4, portions of the semiconductor elements 10 are exposed from the pad portion 421 in plan view. In other words, the portions of the semiconductor elements 10 do not overlap with the pad portion 421 in plan view.

As shown in FIG. 4, the pad portion 421 is formed with a closed region R1 in plan view. To facilitate understanding, the closed region R1 is indicated with dots in FIG. 4. The closed region R1 is surrounded by three line segments L12, L23 and L31. The line segment L12 connects a first vertex P1 and a second vertex P2. The line segment L23 connects the second vertex P2 and a third vertex P3. The line segment L31 connects the third vertex P3 and the first vertex P1. In plan view, the first vertex P1, the second vertex P2, and the third vertex P3 are not on the same straight line.

As shown in FIG. 4, the first vertex P1 overlaps with the outermost semiconductor 10 located in the y1 direction (outer element 10A in the y1 direction) among the plurality of semiconductor elements 10 in plan view. For example, the first vertex P1 overlaps with the center of the outer element 10A located in the y1 direction in plan view. Since the obverse surface electrodes 11 of the semiconductor elements 10 are electrically connected to the pad portion 421 via the block members 429, the first vertex P1 may overlap with the center of the block member 429 connected to the outer element 10A located in the y1 direction in plan view. As shown in FIG. 4, the first vertex P1 overlaps with the conductive substrate 32A in plan view.

As shown in FIG. 4, the second vertex P2 overlaps with the outermost semiconductor element 10 located in the y2 direction (outer element 10A in the y2 direction) among the plurality of semiconductor elements 10 in plan view. For example, the second vertex P2 overlaps with the center of the outer element 10A located in the y2 direction in plan view. Since the obverse surface electrodes 11 of the semiconductor elements 10 are electrically connected to the pad portion 421 via the block members 429, the second vertex P2 may overlap with the center of the block member 429 connected to the outer element 10A located in the y2 direction in plan view. As shown in FIG. 4, the second vertex P2 overlaps with the conductive substrate 32A in plan view.

As shown in FIG. 4, the third vertex P3 is located on a perpendicular bisector L0 of the line segment L12 in plan view. As shown in FIG. 4, the third vertex P3 is located on an abutting edge 421a of the pad portion 421 in plan view. The abutting edge 421a is a portion (side) of the pad portion 421 that is in contact with the joining portion 423 (first portion 424 described below) in plan view. As shown in FIG. 4, the third vertex P3 overlaps with the conductive substrate 32B in plan view.

The terminal portion 422 is exposed from the resin member 60. As shown particularly in FIG. 4, the terminal portion 422 extends from the resin member 60 in the x1 direction in plan view. The terminal portion 422 has a rectangular shape in plan view, for example. The terminal portion 422 is aligned with the terminal portion 412 in the y direction, and overlaps with the terminal portion 412 as viewed in the y direction. In the present embodiment, the terminal portion 422 is offset in the y2 direction relative to the terminal portion 412, as shown particularly in FIGS. 1 to 5. As shown particularly in FIGS. 4 and 5, the terminal portion 422 is offset in the y2 direction relative to the center of the resin member 60 in the y direction. The terminal portion 422 is an example of a "first terminal portion".

The joining portion 423 connects the pad portion 421 and the terminal portion 422. The joining portion 423 is partially bent. The joining portion 423 includes a first portion 424, a second portion 425, and a third portion 426.

The first portion 424 is in contact with the pad portion 421 (abutting edge 421a). The first portion 424 has a rectangular shape in plan view. In the example shown in FIG. 4, the first portion 424 has a band shape extending in the x direction. The first portion 424 extends in the x direction from a portion of an edge of the pad portion 421, where the edge of the pad portion 421 is located in the x1 direction and the above-mentioned portion of the edge is located in the center of the edge in the y direction. The first portion 424 is smaller than the pad portion 421 in the y direction. As shown in FIG. 4, the first portion 424 overlaps with the perpendicular bisector L0 in plan view. The first portion 424 has a pair of edges 424a. Each of the edges 424a is connected to the pad portion 421, and extends from the pad portion 421 in the x1 direction. The pair of edges 424a are positioned on the two inner elements 10B, respectively, as viewed in the x direction. When the number of inner elements 10B is one, the pair of edges 424a are positioned on the single inner element 10B as viewed in the x direction.

The second portion 425 is connected to the first portion 424 and the third portion 426. The second portion 425 extends in the y direction from an end of an edge 424a of the first portion 424, where the edge 424a is located in the y2 direction and the above-mentioned end of the edge 424a is located in the x1 direction. The second portion 425 has a band shape in plan view. In order to suppress misalignment of the input terminal 42, an insulating block member may be disposed between the second portion 425 and the conductive substrate 32B.

The third portion 426 is connected to the second portion 425 and the terminal portion 422. The third portion 426 extends in the x direction from a portion of an edge of the second portion 425, where the edge is located in the x1 direction and the above-mentioned portion of the edge is located in the y2 direction. The third portion 426 has substantially the same dimension as the terminal portion 422 in the y direction.

The output terminal 43 outputs AC power (voltage) or DC power (voltage) converted by the semiconductor elements 10 and 20. As shown in FIGS. 1 to 4, the output terminal 43 is offset in the x2 direction in the semiconductor device A1. The output terminal 43 includes a pad portion 431 and a terminal portion 432.

The pad portion 431 is covered with the resin member 60. As shown in FIGS. 2, 4, 5, and 10, the pad portion 431 is electrically bonded to the conductive substrate 32A via a conductive block member 439. As with the block members 419 and 429, the block member 439 may be made of Cu, a Cu alloy, a composite of CuMo, or a composite of CIC, but the material of the block member 439 is not limited to these examples. The pad portion 431 is bonded to the block member 439, and the block member 439 is bonded to the conductive substrate 32A. Bonding between the pad portion 431 and the block member 439, and bonding between the block member 439 and the conductive substrate 32A may be achieved by any of bonding with a conductive bonding member, laser bonding, or ultrasonic bonding. In the configuration described above, the bonding between the pad portion 431 and the conductive substrate 32A is achieved via the block member 439. However, in an alternative example, the pad portion 431 may be partially bent so that the pad portion 431 is directly bonded to the conductive substrate 32A.

The terminal portion 432 is exposed from the resin member 60. As shown particularly in FIG. 4, the terminal portion 432 extends from the resin member 60 in the x2 direction. The terminal portion 432 has a rectangular shape in plan view, for example. The terminal portion 432 is an example of a "third terminal portion".

The pair of control terminals 44A and 44B and the pair of detection terminals 45A and 45B are aligned along the x direction, for example. The pair of control terminals 44A and 44B and the pair of detection terminals 45A and 45B have substantially the same shape. Each of the control terminals 44A and 44B and the detection terminals 45A and 45B has an L-shape as viewed in the x direction. As shown in FIG. 9, the pair of control terminals 44A and 44B and the pair of detection terminals 45A and 45B overlap with each other as viewed in the x direction. As shown particularly in FIGS. 5 and 6, the control terminal 44A and the detection terminal 45A are located next to the conductive substrate 32A in the y direction in plan view. As shown particularly in FIGS. 5 and 6, the control terminal 44B and the detection terminal 45B are located next to the conductive substrate 32B in the y direction in plan view. The pair of control terminals 44A and 44B and the pair of detection terminals 45A and 45B protrude from the surface (resin side surface 633 described below) of the resin member 60 that faces in the y1 direction, for example.

As shown particularly in FIGS. 5 and 6, the pair of control terminals 44A and 44B are electrically connected to the pair of gate layers 34A and 34B, respectively, via the first connecting wires 53. The first drive signal (gate voltage) for driving the semiconductor elements 10 is inputted to the control terminal 44A. Accordingly, the control terminal 44A is a terminal to which the first drive signal is inputted. The second drive signal (gate voltage) for driving the semiconductor elements 20 is inputted to the control terminal 44B. Accordingly, the control terminal 44B is a terminal to which the second drive signal is inputted.

As shown in FIG. 6, each of the pair of control terminals 44A and 44B includes a pad portion 441 and a terminal portion 442. The pad portion 441 of each of the control terminals 44A and 44B is covered with the resin member 60. With this configuration, the control terminals 44A and 44B are supported by the resin member 60. The terminal portion 442 is connected to the pad portion 441 and exposed from the resin member 60. Each of the control terminals 44A and 44B is bent at the terminal portion 442.

As shown particularly in FIGS. 5 and 6, the pair of detection terminals 45A and 45B are electrically connected to the pair of detection layers 35A and 35B via the second connecting wires 54. The voltage applied to each of the obverse surface electrodes 11 of the semiconductor elements 10 (i.e., volage corresponding to the source current) is detected from the detection terminal 45A. Accordingly, the detection terminal 45A is a source signal detection terminal for the semiconductor elements 10. The voltage applied to each of the obverse surface electrodes 21 of the semiconductor elements 20 (i.e., volage corresponding to the source current) is detected from the detection terminal 45B. Accordingly, the detection terminal 45B is a source signal detection terminal for the semiconductor elements 20.

As shown in FIG. 6, each of the pair of detection terminals 45A and 45B includes a pad portion 451 and a terminal portion 452. The pad portion 451 of each of the detection terminals 45A and 45B is covered with the resin member 60. With this configuration, the detection terminals 45A and 45B are supported by the resin member 60. The terminal portion 452 is connected to the pad portion 451 and exposed from the resin member 60. Each of the detection terminals 45A and 45B is bent at the terminal portion 452.

Each of the connecting members electrically connects two isolated members. As described above, the connecting members include the gate wires 51, the detection wires 52, the pair of first connecting wires 53, the pair of second connecting wires 54, and the lead plates 55.

The gate wires 51, the detection wires 52, the pair of first connecting wires 53, and the pair of second connecting wires 54 are so-called bonding wires. The gate wires 51, the detection wires 52, the pair of first connecting wires 53, and the pair of second connecting wires 54 are each of made of one of Al, Au, Cu, and alloys of these metals. The lead plates 55 are conductive plate-like members. The lead plates 55 may be made of Cu, a Cu alloy, a composite of CuMo, or a composite of CIC, but the material of the lead plates 55 is not limited to these examples.

As shown in FIGS. 5 and 6, each of the gate wires 51 has one end bonded to either the control electrode 12 of a semiconductor element 10 or the control electrode 22 of a semiconductor element 20 and the other end bonded to one of the gate layers 34A and 34B. As shown in FIG. 5, the other end of each gate wire 51 is bonded to a hook-shaped portion 342 as appropriate. The gate wires 51 include those electrically connecting the control electrodes 12 of the semiconductor elements 10 and the gate layer 34A, and those electrically connecting the control electrodes 22 of the semiconductor elements 20 and the gate layer 34B.

As shown in FIGS. 5 and 6, each of the detection wires 52 has one end bonded to either the obverse surface electrode 11 of a semiconductor element 10 or the obverse surface electrode 21 of a semiconductor element 20 and the other end bonded to one of the detection layers 35A and 35B. As shown in FIG. 5, the other end of each gate wire 52 is bonded to a hook-shaped portion 352 as appropriate. The detection wires 52 include those electrically connecting the obverse surface electrodes 11 of the semiconductor elements 10 and the detection layer 35A, and those electrically connecting the obverse surface electrodes 21 of the semiconductor elements 20 and the detection layer 35B.

As shown in FIGS. 5 and 6, one of the pair of first connecting wires 53 has one end bonded to the gate layer 34A and the other end bonded to the control terminal 44A. As a result, the gate layer 34A and the control terminal 44A are electrically connected to each other via the first connecting wire 53. As shown in FIGS. 5 and 6, the other one of the pair of first connecting wires 53 has one end bonded to the gate layer 34B and the other end bonded to the control terminal 44B. As a result, the gate layer 34B and the control terminal 44B are electrically connected to each other via the first connecting wire 53. Each of the second connecting wires 54 is connected to an end of the band-shaped portion 351 of either the detection layer 35A or 35B in the y direction, where the above-mentioned end is located closer to either the detection terminal 45A or 45B than the other end in the y direction.

As shown in FIGS. 5 and 6, one of the pair of second connecting wires 54 has one end bonded to the detection layer 35A and the other end bonded to the detection terminal 45A. As a result, the detection layer 35A and the detection terminal 45A are electrically connected to each other via the second connecting wire 54. As shown in FIGS. 5 and 6, the other one of the pair of detection wires 52 has one end bonded to the detection layer 35B and the other end bonded to the detection terminal 45B. As a result, the detection layer 35B and the detection terminal 45B are electrically connected to each other via the second connecting wire 54. Each of the second connecting wires 54 is connected to an end of the band-shaped portion 351 of either the detection layer 35A or 35B in the y direction, where the above-mentioned end is located closer to either the detection terminal 45A or 45B than the other end in the y direction.

As shown in FIGS. 5, 6, and 10, each of the lead plates 55 electrically connects the obverse surface electrode 21 of each of the semiconductor elements 20 and the conductive substrate 32A. Each of the lead plates 55 includes a pair of bonding portions 551 and 552.

In each of the lead plates 55, the bonding portion 551 is bonded to the obverse surface electrode 21 of one of the semiconductor elements 20 via a non-illustrated conductive bonding member (e.g., solder, metal paste, or sintered metal). The bonding portion 552 is bonded to the conductive substrate 32A via one of a plurality of conductive block members 559. The block members 559 may be made of Cu, a Cu alloy, a composite of CuMo, or a composite of CIC, but the material of the block members 559 is not limited to these examples. In each of the lead plates 55, the bonding portion 552 is bonded to the block member 559, and the block member 559 is bonded to the conductive substrate 32A. Bonding between the bonding portion 552 and the block member 559, and bonding between the block member 559 and the conductive substrate 32A may be achieved by any of bonding with a conductive bonding member, laser bonding, or ultrasonic bonding. Bonding between the bonding portion 552 and the conductive substrate 32A is not only achieved by bonding with the block member 559, but also by partially bending the bonding portion 552 or by forming the bonding portion 552 to be thicker than the bonding portion 551, so that the bonding portion 552 is directly bonded to the conductive substrate 32A.

As shown in FIG. 1 and FIGS. 3 to 10, the resin member 60 covers the semiconductor elements 10 and 20, the support substrate 30 (except for the reverse surfaces 312 of the pair of insulating substrates 31A and 31B), portions of the terminals (the two input terminals 41 and 42, the output terminal 43, the pair of control terminals 44A and 44B, and the pair of detection terminals 45A and 45B), and the connecting members (the gate wires 51, the detection wires 52, the pair of first connecting wires 53, the pair of second connecting wires 54, and the lead plates 55). The resin member 60 is made of epoxy resin, for example. As shown particularly in FIGS. 4, 5, and 10, the resin member 60 has a resin obverse surface 61, a resin reverse surface 62, and a plurality of resin side surfaces 631 to 634.

As shown particularly in FIG. 10, the resin obverse surface 61 and the resin reverse surface 62 are spaced apart from each other in the z direction. The resin obverse surface 61 faces in the z2 direction, and the resin reverse surface 62 faces in the z1 direction. As shown in FIG. 8, the resin reverse surface 62 has a frame shape surrounding the reverse surfaces 312 of the pair of insulating substrates 31A and 31B in plan view. The reverse surfaces 312 of the pair of insulating substrates 31A and 31B are exposed from the resin reverse surface 62. The resin side surfaces 631 to 634 are connected to the resin obverse surface 61 and the resin reverse surface 62 and sandwiched between them in the z direction. As shown in FIGS. 3 to 5, 7 and 8, the resin side surface 631 and the resin side surface 632 are spaced apart from each other in the x direction. The resin side surface 631 faces in the x1 direction, and the resin side surface 632 faces in the x2 direction. The two input terminals 41 and 42 protrude from the resin side surface 631, and the output terminal 43 protrudes from the resin side surface 632. As shown in FIGS. 3 to 5, 8 and 9, the resin side surface 633 and the resin side surface 634 are spaced apart from each other in the y direction. The resin side surface 633 faces in the y1 direction, and the resin side surface 634 faces in the y2 direction. The pair of control terminals 44A and 44B and the pair of detection terminals 45A and 45B protrude from the resin side surface 633.

As shown in FIGS. 8 and 10, the resin member 60 includes a recess 65 recessed from the resin reverse surface 62 in the z direction. As shown in FIG. 8, the recess 65 has an annular shape surrounding the support substrate 30 in plan view. The shape of the recess 65, the arrangement thereof, the number of recesses 65, and so on are not limited to the examples shown in FIGS. 8 and 10. Note that the recess 65 may not be formed in the resin member 60.

The following describes the operation and advantages of the semiconductor device A1.

The semiconductor device A1 has the pad portion 421 (input terminal 42) electrically connected to the semiconductor elements 10. The pad portion 421 includes the closed region R1 surrounded by the three line segments L12, L23, and L31. The line segment L12 connects the first vertex P1 and the second vertex P2, the line segment L23 connects the second vertex P2 and the third vertex P3, and the line segment L31 connects the third vertex P3 and the first vertex P1. The first vertex P1 overlaps with the outermost semiconductor 10 located in the y1 direction (outer element 10A in the y1 direction) among the plurality of semiconductor elements 10 in plan view. The second vertex P2 overlaps with the outermost semiconductor element 10 located in the y2 direction (outer element 10A in the y2 direction) among the plurality of semiconductor elements 10 in plan view. The third vertex P3 is located on the perpendicular bisector L0 of the line segment L12 in plan view. According to this configuration, a current path from each of the semiconductor elements 10 to the third vertex P3 is formed in the pad portion 421, for example. There is almost no difference between the distance from a point on the perpendicular bisector L0 to the first vertex P1 and the distance from said point on the perpendicular bisector L0 to the second vertex P2. Thus, there is almost no difference between the distance from the third vertex P3 to the first vertex P1 and the distance from the third vertex P3 to the second vertex P2. In other words, it is possible to reduce the difference in the current path from each of the semiconductor elements 10 to the third vertex P3 in the pad portion 421. As such, the semiconductor device A1 provides a current path that passes through the third vertex P3 for the current flowing from each of the semiconductor elements 10 to the terminal portion 422 via the pad portion 421, thereby suppressing the deviation in the current flowing through each of the semiconductor elements 10 connected in parallel.

In the semiconductor device A1, the input terminal 42 includes the joining portion 423 connecting the pad portion 421 and the terminal portion 422. The joining portion 423 includes the first portion 424 connected to the pad portion 421, and the first portion 424 overlaps with the perpendicular bisector L0 in plan view. According to this configuration, when a current flows from the pad portion 421 to the joining portion 423, the current passes through the first portion 424 first. If the first portion 424 does not overlap with the perpendicular bisector L0 in plan view, the current path from each of the semiconductor elements 10 to the terminal portion 422 may not pass through the third vertex P3. In the semiconductor device A1, however, the first portion 424 overlaps with the perpendicular bisector L0 in plan view, so that the current path from each of the semiconductor elements 10 to the terminal portion 422 passes through the third vertex P3. As such, the semiconductor device A1 provides a current path that passes through the third vertex P3, thereby suppressing the deviation in the current flowing through each of the semiconductor elements 10 connected in parallel.

In particular, the first portion 424 of the semiconductor device A1 is smaller than the pad portion 421 in the y direction. According to this configuration, when a current flowing through the pad portion 421 is inputted to the first portion 424, the current is concentrated at the first portion 424. This makes it possible to reduce the number of current paths not passing through the third vertex P3 among the current paths from the semiconductor elements 10 to the terminal portion 422. Furthermore, the pair of edges 424a of the first portion 424 are positioned on the two inner elements 10B as viewed in the x direction. This configuration can narrow the abutting portion between the first portion 424 (joining portion 423) and the pad portion 421, thereby further reducing the number of current paths not passing through the third vertex P3 among the current paths from the semiconductor elements 10 to the terminal portion 422.

In the semiconductor device A1, the gate layer 34A includes the band-shaped portion 341 and the hook-shaped portions 342. Each of the gate wires 51 has one end bonded to a semiconductor element 10 and the other end bonded to a hook-shaped portion 342 as appropriate. This configuration can make uniform the lengths of the signal paths of the first drive signal for driving the semiconductor elements 10 connected in parallel. If the signal paths of the first drive signal have different lengths, the semiconductor element corresponding to the shortest signal path will be driven first. In this case, the driven states of the semiconductor elements 10 connected in parallel become non-uniform, resulting in overvoltage and overcurrent in one or more of the semiconductor elements 10. In view of this, in the semiconductor device A1, the signal paths of the first drive signal inputted to each of the semiconductor elements 10 are made uniform, so that the drive states of the semiconductor elements 10 can be made more uniform than if the gate layer 34A is not provided with the hook-shaped portions 342. This also applies to the relationship between the gate layer 34B and the semiconductor elements 20.

Figure 11:
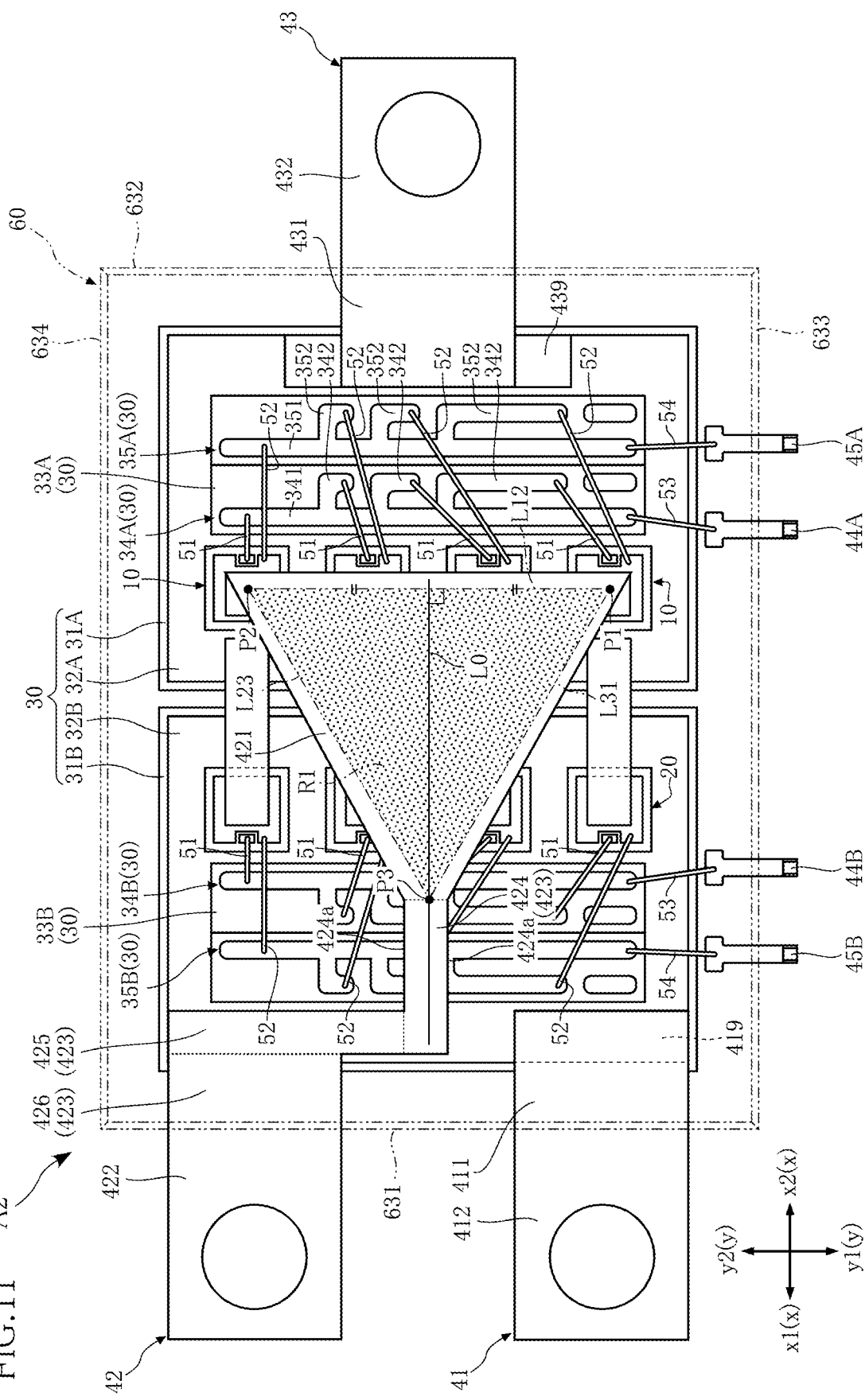
FIG. 11 is a plan view showing a semiconductor device according to a second embodiment, with a resin member indicated by an imaginary line.

FIG. 11 shows a semiconductor device A2 according to a second embodiment. FIG. 11 is a plan view showing the semiconductor device A2, with the resin member 60 indicated by an imaginary line.

The semiconductor device A2 is different from the semiconductor device A1 in the shape of the pad portion 421 of the input terminal 42 in plan view. Except for this point, the semiconductor device A2 is configured in the same manner as the semiconductor device A1.

The pad portion 421 of the semiconductor device A2 has substantially a triangular shape in plan view. As shown in FIG. 11, the triangular pad portion 421 also includes a closed region R1. To facilitate understanding, the closed region R1 is indicated with dots in FIG. 11. In the example shown in FIG. 11, the pad portion 421 is formed along the closed region R1 in plan view.

As with the semiconductor device A1, the semiconductor device A2 is configured such that the pad portion 421 includes the closed region R1. Accordingly, as with the semiconductor device A1, the semiconductor device A2 provides a current path that passes through the third vertex P3 for the current flowing from each of the semiconductor elements 10 to the terminal portion 422 via the pad portion 421, thereby suppressing the deviation in the current flowing through each of the semiconductor elements 10 connected in parallel.

In the semiconductor device A2, substantially the entirety of the pad portion 421 is the closed region R1 in plan view. This configuration suppresses the current flowing through the section of the pad portion 421 excluding the closed region R1. Accordingly, the semiconductor device A2 can suppress a wasteful current flow in the pad portion 421.

Figure 12:
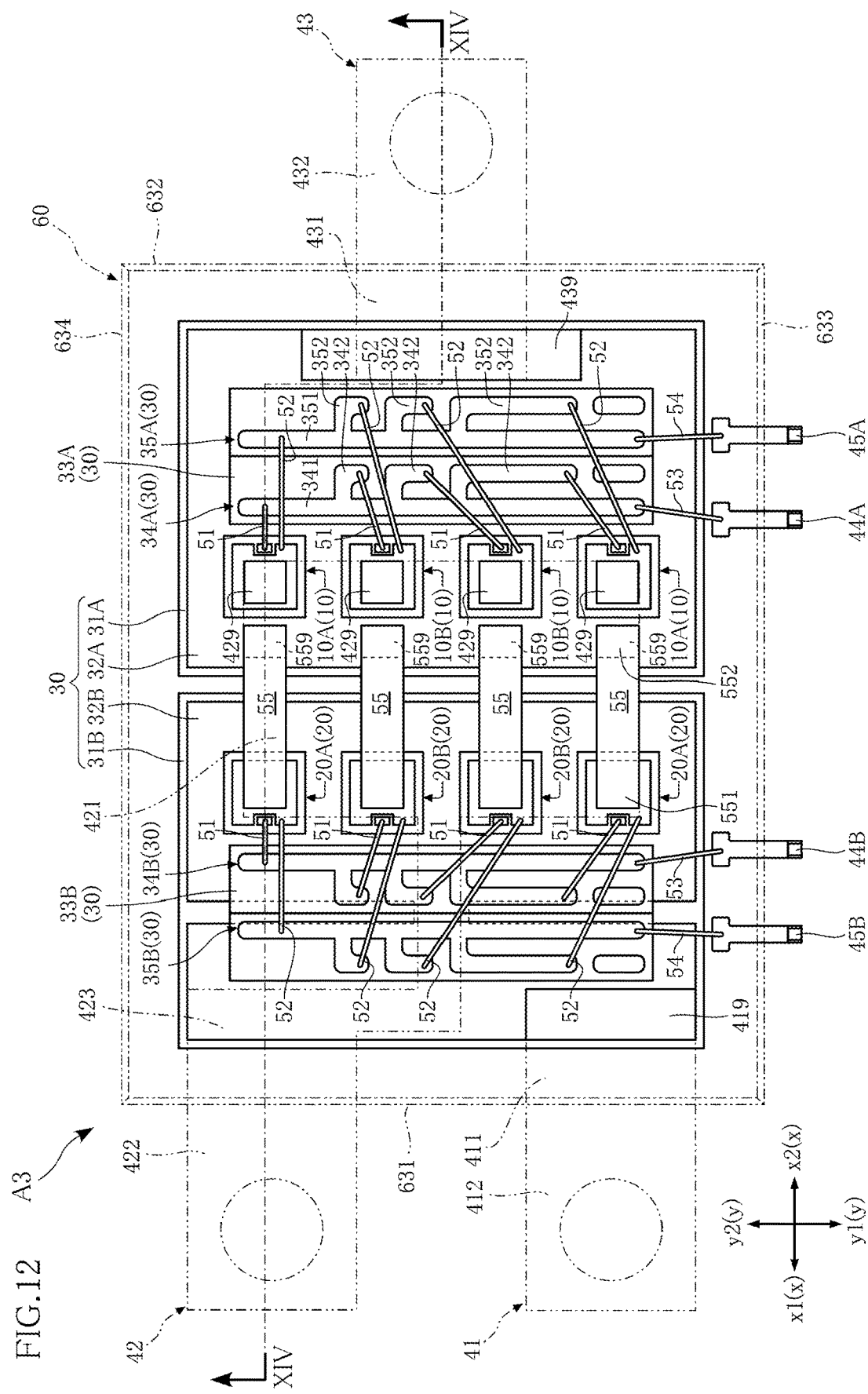
FIG. 12 is a plan view showing a semiconductor device according to a third embodiment, with two input terminals, an output terminal, and a resin member indicated by imaginary lines.
Figure 13:
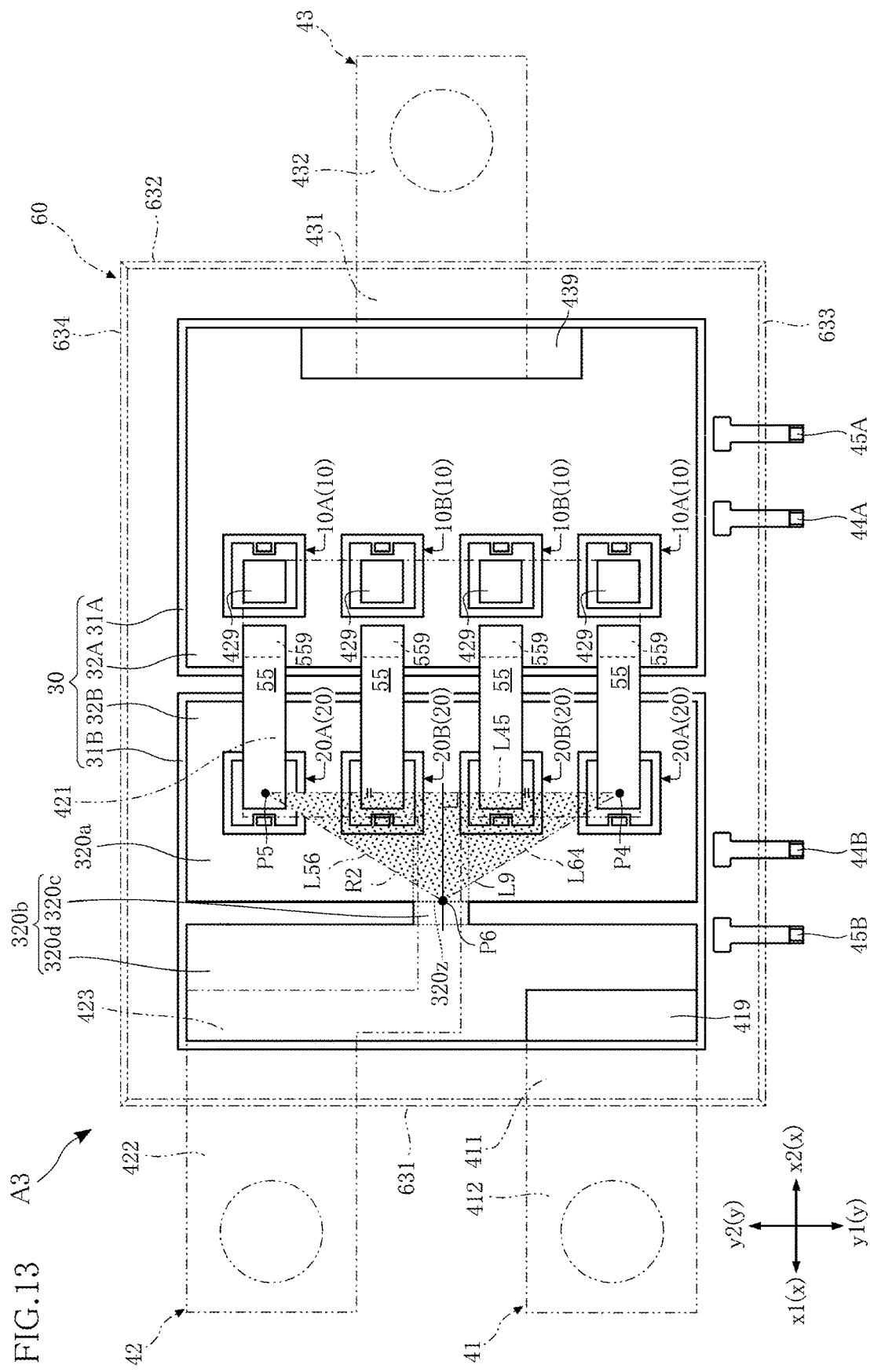
FIG. 13 shows main parts extracted from the plan view of FIG. 12.
Figure 14:
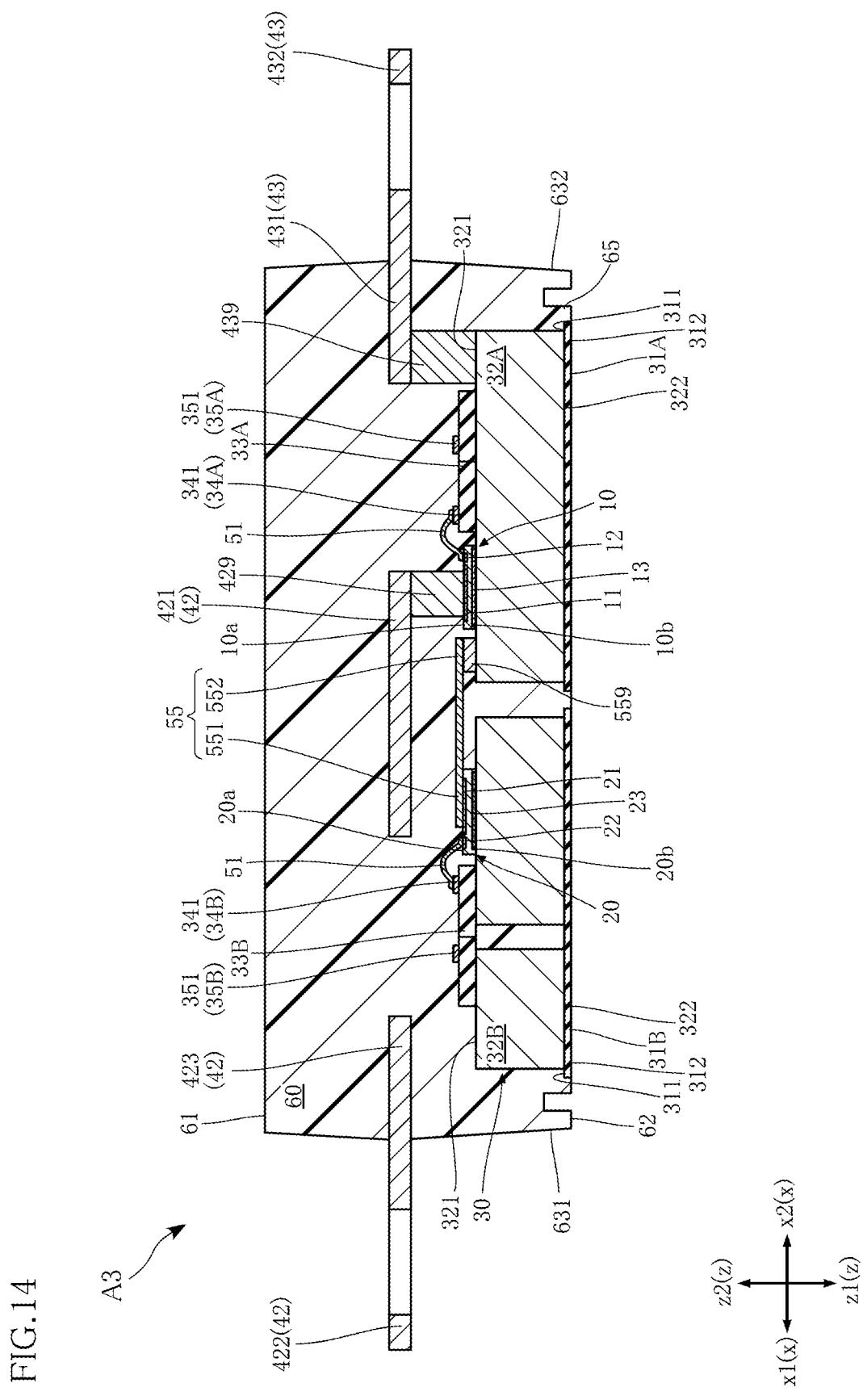
FIG. 14 is a cross-sectional view along line XIV-XIV in FIG. 12.

FIGS. 12 to 14 show a semiconductor device A3 according to a third embodiment. FIG. 12 is a plan view showing the semiconductor device A3, with the resin member 60, the two input terminals 41 and 42, and the output terminal 43 indicated by imaginary lines. FIG. 13 shows main parts extracted from the plan view of FIG. 12. FIG. 13 corresponds to the plan view of FIG. 12, and mainly shows the semiconductor elements 10 and 20, portions of the support substrate 30 (pair of insulating substrates 31A and 31B and pair of conductive substrates 32A and 32B), the lead plates 55, and so on, and omits the pair of insulating layers 33A and 33B, the pair of gate layers 34A and 34B, the pair of detection layers 35A and 35B, the gate wires 51, the detection wires 52, the pair of first connecting wires 53, the pair of second connecting wires 54, and so on. FIG. 14 is a cross-sectional view along line XIV-XIV in FIG. 12.

As shown in FIGS. 12 to 14, the semiconductor device A3 is different from the semiconductor device A1 in the configuration of the conductive substrate 32B. Except for this point, the semiconductor device A3 is configured in the same manner as the semiconductor device A1.

In plan view, the conductive substrate 32B of the semiconductor device A3 has recessed portions, each of which is recessed inward in the y direction from a respective one of the pair of edges extending along the x direction. The conductive substrate 32B includes a pad portion 320a and a joining portion 320b.

The pad portion 320a is where the semiconductor elements 20 are mounted. The pad portion 320a has a rectangular shape in plan view. As shown in FIG. 13, the pad portion 320a is formed with a closed portion R2 in plan view. To facilitate understanding, the closed region R2 is indicated with dots in FIG. 13. The closed region R2 is surrounded by three line segments L45, L56 and L64. The line segment L45 connects a first vertex P4 and a second vertex P5. The line segment L56 connects the second vertex P5 and a third vertex P6. The line segment L64 connects the third vertex P6 and the first vertex P4. In plan view, the first vertex P4, the second vertex P5, and the third vertex P6 are not on the same straight line.

The first vertex P4 overlaps with the outermost semiconductor 20 located in the y1 direction (outer element 20A in the y1 direction) among the plurality of semiconductor elements 20 in plan view. For example, the first vertex P4 overlaps with the center of the outer element 20A located in the y1 direction in plan view. In the present embodiment, the reverse surface electrode 23 of each semiconductor element 20 is formed over substantially the entirety of the element reverse surface 20b of the semiconductor element 20. As a result, the first vertex P4 overlaps with the center of the reverse surface electrode 23 of the outer element 20A located in the y1 direction in plan view.

The second vertex P5 overlaps with the outermost semiconductor element 20 located in the y2 direction (outer element 20A in the y2 direction) among the plurality of semiconductor elements 20 in plan view. For example, the second vertex P5 overlaps with the center of the outer element 20A located in the y2 direction in plan view. In the present embodiment, the reverse surface electrode 23 of each semiconductor element 20 is formed over substantially the entirety of the element reverse surface 20b of the semiconductor element 20. As a result, the second vertex P5 overlaps with the center of the reverse surface electrode 23 of the outer element 20A located in the y2 direction in plan view.

As shown in FIG. 13, the third vertex P6 is located on a perpendicular bisector L9 of the line segment L45 in plan view. As shown in FIG. 13, the third vertex P6 is located on an abutting edge 320z of the pad portion 320a in plan view. The abutting edge 320z is a portion (side) of the pad portion 320a that is in contact with the joining portion 320b (first portion 320c described below) in plan view.

The joining portion 320b connects the pad portion 320a and the input terminal 41. As shown in FIGS. 12 and 13, the joining portion 320b is bonded to the input terminal 41 via the block member 419. As such, the joining portion 320b connects the pad portion 320a and the terminal portion 412 (input terminal 41). As shown in FIG. 13, the joining portion 320b includes a first portion 320c and a second portion 320d.

The first portion 320c is in contact with the pad portion 320a. The first portion 320c has a rectangular shape in plan view. The first portion 320c extends in the x direction from a portion of an edge of the pad portion 320a, where the edge of the pad portion 320a is located in the x1 direction and the portion of the edge is located in the center of the edge in the y direction. The first portion 320c is smaller in the y direction than the pad portion 320a. As shown in FIG. 13, the first portion 320c overlaps with the perpendicular bisector L9 in plan view. Due to the first portion 320c, the conductive substrate 32B has recessed portions as described above.

The second portion 320d is bonded to the block member 419. The second portion 320d is connected to the first portion 320c, as well as to the input terminal 41 via the block member 419. The second portion 320d has a rectangular shape in plan view. The second portion 320d is larger than the first portion 320c in the y direction, and may have substantially the same dimension as the pad portion 320a in the y direction.

As described above, the conductive substrate 32B is formed with the portions recessed inward in the y direction since the first portion 320c is smaller than each of the pad portion 320a and the second portion 320d in the y direction.

As with the semiconductor devices A1 and A2, the semiconductor device A3 is configured such that the pad portion 421 includes the closed region R2. Accordingly, as with the semiconductor devices A1 and A2, the semiconductor device A3 provides a current path that passes through the third vertex P6 for the current flowing from each of the semiconductor elements 10 to the terminal portion 422 via the pad portion 421, thereby suppressing the deviation in the current flowing through each of the semiconductor elements 10 connected in parallel.

In the semiconductor device A3, the conductive substrate 32B includes the pad portion 320a. The pad portion 320a includes the closed region R2 surrounded by the three line segments L45, L56, and L64. The line segment L45 connects the first vertex P4 and the second vertex P5, the line segment L56 connects the second vertex P5 and the third vertex P6, and the line segment L64 connects the third vertex P6 and the first vertex P4. In plan view, the first vertex P4 overlaps with the outermost semiconductor element 20 in the y1 direction among the plurality of semiconductor elements 20. In plan view, the second vertex P5 overlaps with the outermost semiconductor element 20 in the y2 direction among the plurality of semiconductor elements 20. The third vertex P6 is located on the perpendicular bisector L9 of the line segment L45. According to this configuration, a current path from each of the semiconductor elements 20 to the third vertex P6 is formed in the pad portion 320a. As such, the semiconductor device A3 can provide a current path that passes through the third vertex P6 for the current flowing from each of the semiconductor elements 20 to the terminal portion 412 via the pad portion 320a, thereby suppressing the deviation in the current flowing through each of the semiconductor elements 20 connected in parallel.

In the semiconductor device A3, the conductive substrate 32B includes the joining portion 320b connected to the pad portion 320a and the terminal portion 412 (input terminal 41). The joining portion 320b includes the first portion 320c that is in contact with the pad portion 320a, and the first portion 320c overlaps with the perpendicular bisector L9 in plan view. According to this configuration, when a current flows from the pad portion 320a to the joining portion 320b, the current flows through the first portion 320c first. If the first portion 320c does not overlap with the perpendicular bisector L9 in plan view, the current path from each of the semiconductor elements 20 to the terminal portion 412 may not pass through the third vertex P6. In the semiconductor device A3, however, the first portion 320c overlaps with the perpendicular bisector L9 in plan view, so that the current path from each of the semiconductor elements 20 to the terminal portion 412 passes through the third vertex P6. As such, the semiconductor device A3 provides a current path that passes through the third vertex P6, thereby suppressing the deviation in the current flowing through each of the semiconductor elements 20 connected in parallel. Such a configuration is useful when the electrical resistivity of the conductive substrate 32B is larger than or equal to the electrical resistivity of the input terminal 42.

In particular, the first portion 320c of the semiconductor device A3 is smaller than the pad portion 320a in the y direction. According to this configuration, when a current flowing through the pad portion 320a is inputted to the first portion 320c, the current is concentrated at the first portion 320c. This makes it possible to reduce the number of current paths not passing through the third vertex P6 among the current paths from the semiconductor elements 20 to the terminal portion 412. Furthermore, a pair of edges of the first portion 320c are positioned on the two inner elements 20B as viewed in the x direction. This configuration can narrow the abutting portion between the first portion 320c (joining portion 320b) and the pad portion 320a, thereby further reducing the number of current paths not passing through the third vertex P6 among the current paths from the semiconductor elements 20 to the terminal portion 412.

Figure 15:
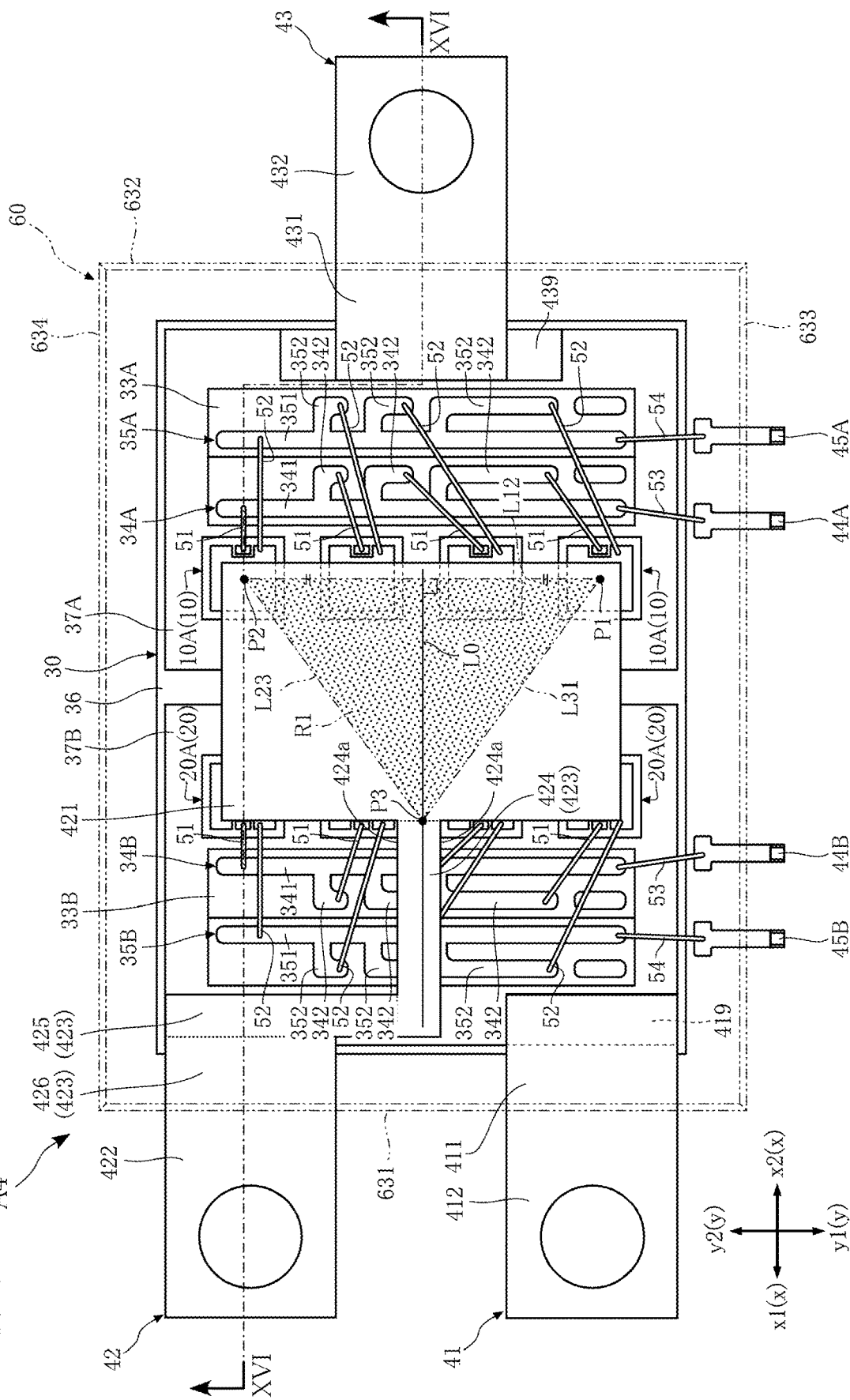
FIG. 15 is a plan view showing a semiconductor device according to a fourth embodiment, with a resin member indicated by an imaginary line.
Figure 16:
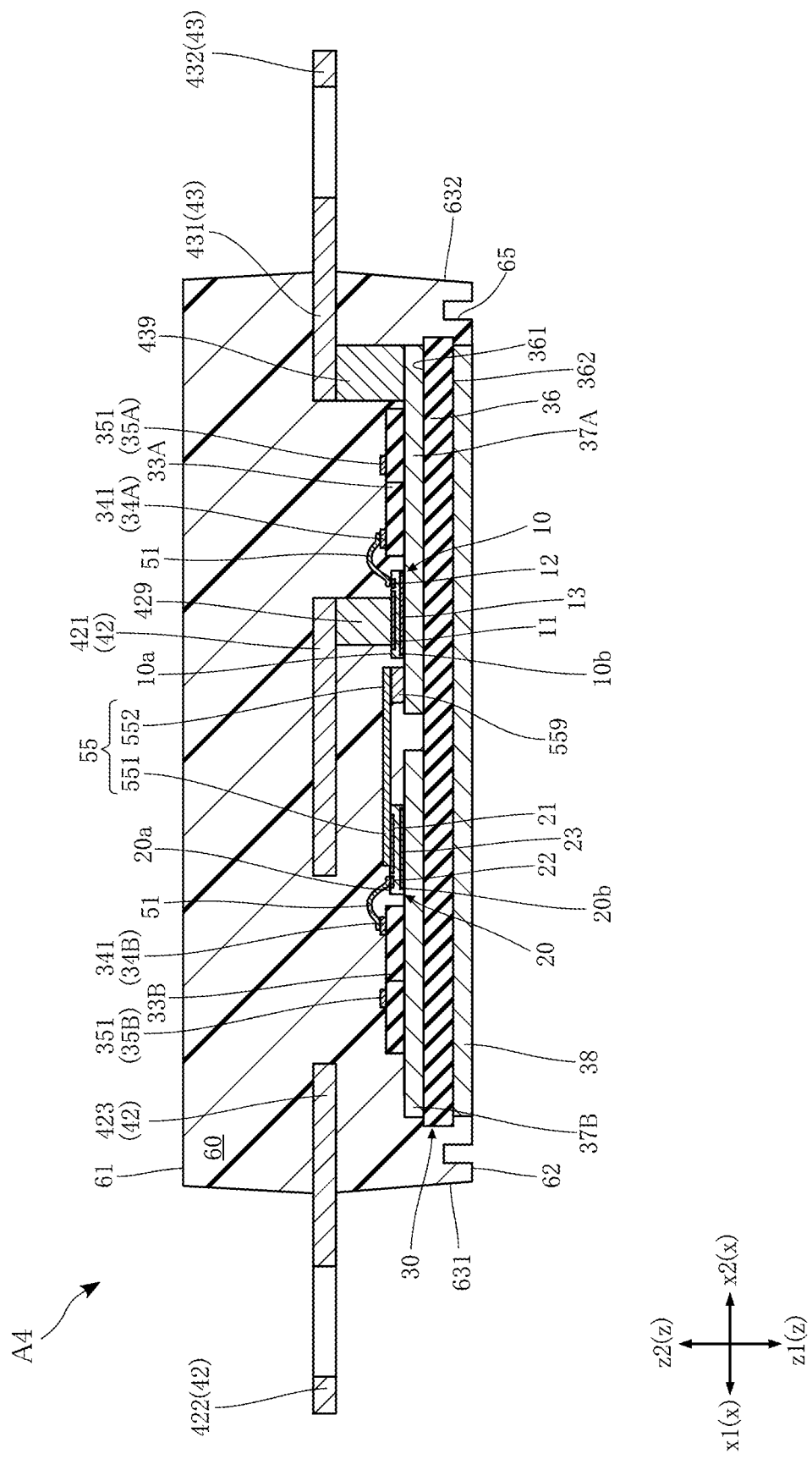
FIG. 16 is a cross-sectional view along line XVI-XVI in FIG. 15.

FIGS. 15 and 16 show a semiconductor device A4 according to the fourth embodiment. FIG. 15 is a plan view showing the semiconductor device A4, with the resin member 60 indicated by an imaginary line. To facilitate understanding, the closed region R1 is indicated with dots in FIG. 15. FIG. 16 is a cross-sectional view along line XVI-XVI in FIG. 15.

As shown in FIG. 15, the semiconductor device A4 is different from the semiconductor device A1 in the configuration of the support substrate 30. Except for this point, the semiconductor device A4 is configured in the same manner as the semiconductor device A1.

The support substrate 30 of the semiconductor device A4 is a so-called direct bonded copper (DBC) substrate. The support substrate 30 may be a direct bonded aluminum (DBA) substrate instead of a DBC substrate. As shown in FIG. 15, the support substrate 30 of the semiconductor device A4 includes an insulating substrate 36, a pair of obverse-surface metal layers 37A and 37B, and a reverse-surface metal layer 38.

As with the insulating substrates 31A and 31B, the insulating substrate 36 is made of a ceramic material having excellent thermal conductivity, for example. The insulating substrate 36 has a rectangular shape in plan view, for example. As shown in FIG. 15, the insulating substrate 36 has an obverse surface 361 and a reverse surface 362. The obverse surface 361 and the reverse surface 362 are spaced apart from each other in the z direction. The obverse surface 361 faces in the z2 direction, and the reverse surface 362 faces in the z1 direction.

As shown in FIG. 15, the pair of obverse-surface metal layers 37A and 37B are formed on the obverse surface 361 of the insulating substrate 36. In the configuration where the support substrate 30 is a DBC substrate, the material of the pair of obverse-surface metal layers 37A and 37B is Cu, for example. In the configuration where the support substrate 30 is a DBA substrate, the material is Al instead of Cu. The pair of obverse-surface metal layers 37A and 37B are spaced apart from each other in the x direction. The obverse-surface metal layer 37A is offset in the x2 direction relative to the obverse-surface metal layer 37B. As with the conductive substrate 32A, a plurality of semiconductor elements 10 are mounted on the obverse-surface metal layer 37A. As with the conductive substrate 32B, a plurality of semiconductor elements 20 are mounted on the obverse-surface metal layer 37B. The obverse-surface metal layers 37A and 37B are thinner than the conductive substrates 32A and 32B. In the present embodiment, the obverse-surface metal layer 37A is an example of the "first conductive member", and the obverse-surface metal layer 37B is an example of the "second conductive member".

The reverse-surface metal layer 38 is formed on the reverse surface 362 of the insulating substrate 36. The reverse-surface metal layer 38 is made of the same material as the obverse-surface metal layers 37A and 37B. The reverse-surface metal layer 38 may be covered with the resin member 60. Alternatively, the surface of the reverse-surface metal layer 38 facing in the z1 direction may be exposed from the resin member 60 (resin reverse surface 62).

The configuration of the support substrate 30 in the semiconductor device A4 may be modified as follows. For example, the insulating substrate 36 may not be a single insulating substrate, but may be divided for each of the pair of obverse-surface metal layers 37A and 37B instead. In other words, as is the case with the semiconductor device A1, the insulating substrate 36 may be divided into two insulating substrates, and the pair of obverse-surface metal layers 37A and 37B may be formed on the respective insulating substrates. Furthermore, the reverse-surface metal layer 38 may not be a single reverse-surface metal layer, but may be divided into two reverse-surface metal layers instead. In this case, the two reverse-surface metal layers are spaced apart from each other in the x direction, and overlap with the pair of the obverse-surface metal layers 37A and 37B, respectively, in plan view. Furthermore, the pair of conductive substrates 32A and 32B described above may be mounted on the pair of obverse-surface metal layers 37A and 37B, respectively.

As with the semiconductor devices A1 to A3, the semiconductor device A4 is configured such that the pad portion 421 includes the closed region R1. Accordingly, as with the semiconductor devices A1 to A3, the semiconductor device A4 provides a current path that passes through the third vertex P3 for the current flowing from each of the semiconductor elements 10 to the terminal portion 422 via the pad portion 421, thereby suppressing the deviation in the current flowing through each of the semiconductor elements 10 connected in parallel.

The semiconductor device according to the present disclosure is not limited to the above embodiments. Various design changes can be made to the specific configurations of the elements of the semiconductor device according to the present disclosure. For example, the semiconductor device of the present disclosure includes the embodiments according to the following clauses.

Clause 1.
  A semiconductor device comprising:
  a plurality of first semiconductor elements each having a first element obverse surface and a first element reverse surface that are spaced apart from each other in a thickness direction, the plurality of first semiconductor elements being electrically connected to each other in parallel;
  a pad portion electrically connected to the plurality of first semiconductor elements; and
  a first terminal portion electrically connected to the pad portion,
  wherein as viewed in the thickness direction, the plurality of first semiconductor elements are aligned along a first direction perpendicular to the thickness direction,
  the pad portion includes a closed region surrounded by three line segments that are each formed by connecting two of a first vertex, a second vertex, and a third vertex that are not on the same straight line,
  as viewed in the thickness direction, the first vertex overlaps with one of the plurality of first semiconductor elements that is located in an outermost position in a first sense of the first direction,
  as viewed in the thickness direction, the second vertex overlaps with one of the plurality of first semiconductor elements that is located in an outermost position in a second sense of the first direction, and
  as viewed in the thickness direction, the third vertex is located on a perpendicular bisector of the line segment connecting the first vertex and the second vertex.

Clause 2.
  The semiconductor device according to clause 1, further comprising a joining portion connecting the pad portion and the first terminal portion,
  wherein the joining portion includes a first portion that is in contact with the pad portion, and
  the first portion overlaps with the perpendicular bisector as viewed in the thickness direction.

Clause 3.
  The semiconductor device according to clause 2,
  wherein the first portion has a pair of edges that are spaced apart from each other in the first direction and extend along a second direction perpendicular to the thickness direction and the first direction, and
  the pair of edges connect to the pad portion as viewed in the thickness direction.

Clause 4.
  The semiconductor device according to clause 3,
  wherein each of the pad portion and the first portion has a rectangular shape as viewed in the thickness direction, and
  the first portion is smaller than the pad portion in the first direction.

Clause 5.
  The semiconductor device according to clause 3 or 4,
  wherein the plurality of first semiconductor elements include two inner elements that are located between the first semiconductor element overlapping with the first vertex as viewed in the thickness direction and the first semiconductor element overlapping with the second vertex as viewed in the thickness direction, the two inner elements being adjacent to each other with the perpendicular bisector therebetween, and
  the pair of edges are positioned on the two inner elements, respectively, as viewed in the second direction.

Clause 6.
  The semiconductor device according to any of clauses 3 to 5,
  wherein a portion of each of the plurality of first semiconductor elements does not overlap with the pad portion as viewed in the thickness direction.

Clause 7.
  The semiconductor device according to any of clauses 3 to 6,
  wherein each of the plurality of first semiconductor elements includes a first obverse surface electrode formed on the first element obverse surface, and a first reverse surface electrode formed on the first element reverse surface, and
  the pad portion is positioned on the first element obverse surfaces as viewed in the thickness direction, and is electrically connected to the first obverse surface electrodes of the plurality of first semiconductor elements.

Clause 8.

The semiconductor device according to clause 7, further comprising a first conductive member on which the plurality of first semiconductor elements are mounted,
  wherein the first reverse surface electrodes of the plurality of first semiconductor elements are bonded to the first conductive member.

Clause 9.

The semiconductor device according to clause 8, wherein the pad portion, the first terminal portion, and the joining portion each have a plate-like shape and are formed integrally.

Clause 10.

The semiconductor device according to clause 9, further comprising a plurality of second semiconductor elements each having a second element obverse surface and a second element reverse surface that are spaced apart from each other in the thickness direction, the plurality of second semiconductor elements being electrically connected to each other in parallel,
  wherein the plurality of first semiconductor elements and the plurality of second semiconductor elements are electrically connected to each other in series.

Clause 11.

The semiconductor device according to clause 10, further comprising a second conductive member on which the plurality of second semiconductor elements are mounted,
  wherein the first conductive member and the second conductive member are spaced apart and aligned in the second direction.

Clause 12.

The semiconductor device according to clause 11, wherein each of the plurality of second semiconductor elements includes a second obverse surface electrode formed on the second element obverse surface, and a second reverse surface electrode formed on the second element reverse surface.

Clause 13.

The semiconductor device according to clause 12, wherein the second reverse surface electrodes of the plurality of second semiconductor elements are bonded to the second conductive member.

Clause 14.

The semiconductor device according to clause 13, further comprising a plurality of connecting members electrically connecting the first conductive member and the second obverse surface electrodes of the plurality of second semiconductor elements.

Clause 15.

The semiconductor device according to clause 14, further comprising:
  a second terminal portion electrically connected to the second conductive member; and
  a third terminal portion electrically connected to the first conductive member.

Clause 16.

The semiconductor device according to clause 15, wherein the pad portion extends across the first conductive member and the second conductive member as viewed in the thickness direction.

Clause 17.

The semiconductor device according to clause 16,
  wherein the first vertex and the second vertex overlap with the first conductive member as viewed in the thickness direction, and
  the third vertex overlaps with the second conductive member as viewed in the thickness direction.

Clause 18.

The semiconductor device according to clause 16 or 17, wherein the second terminal portion is aligned with the first terminal portion in the first direction, and overlaps with the first terminal portion as viewed in the first direction.

Clause 19.

The semiconductor device according to any of clauses 15 to 18, further comprising a resin member covering the plurality of first semiconductor elements and the plurality of second semiconductor elements,
  wherein the first terminal portion, the second terminal portion, and the third terminal portion are exposed from the resin member.

Clause 20.

The semiconductor device according to any of clauses 12 to 19,
  wherein each of the plurality of first semiconductor elements further includes a first control electrode insulated from the first obverse surface electrode and formed on the first element obverse surface, where the first obverse surface electrode and the first reverse surface electrode are electrically connected to each other according to a first drive signal inputted to the first control electrode, and
  each of the plurality of second semiconductor elements further includes a second control electrode insulated from the second obverse surface electrode and formed on the second element obverse surface, where the second obverse surface electrode and the second reverse surface electrode are electrically connected to each other according to a second drive signal inputted to the second control electrode.

Clause 21.

The semiconductor device according to any of clauses 11 to 20, further comprising an insulating substrate on which the first conductive member and the second conductive member are mounted.

Clause 22.

The semiconductor device according to any of clauses 11 to 21, wherein the second conductive member has a smaller electrical resistivity than the pad portion.

REFERENCE SIGNS

A1 to A4: Semiconductor device 10, 20: Semiconductor element
10A, 20A: Outer element 10B, 20B: Inner element
10a, 20a: Element obverse surface
10b, 20b: Element reverse surface
11, 21: Obverse surface electrode 12, 22: Control electrode
13, 23: Reverse surface electrode 14, 24: Insulating film
30: Support substrate 31A, 31B: Insulating substrate
311: Obverse surface 312: Reverse surface
32A, 32B: Conductive substrate 321: Obverse surface
322: Reverse surface 320a: Pad portion
320b: Joining portion 320c: First portion
320d: Second portion 320z: Abutting edge
33A, 33B: Insulating layer 34A, 34B: Gate layer
341: Band-shaped portion 342: Hook-shaped portion
35A, 35B: Detection layer 351: Band-shaped portion
352: Hook-shaped portion 36: Insulating substrate
361: Obverse surface 362: Reverse surface
37A, 37B: Obverse-surface metal layer
38: Reverse-surface metal layer
41: Input terminal 411: Pad portion
412: Terminal portion 419: Block member
42: Input terminal 421: Pad portion
421a: Abutting edge 422: Terminal portion
423: Joining portion 424: First portion
424a: Edge 425: Second portion
426: Third portion 429: Block member -continued

REFERENCE SIGNS

43: Output terminal 431: Pad portion
432: Terminal portion 439: Block member
44A, 44B: Control terminal 441: Pad portion
442: Terminal portion 45A, 45B: Detection terminal
451: Pad portion 452: Terminal portion
51: Gate wire 52: Detection wire
53: First connecting wire 54: Second connecting wire
55: Lead plate 551, 552: Bonding portion
559: Block member 60: Resin member
61: Resin obverse surface 62: Resin reverse surface
631: Resin side surface 632: Resin side surface
633: Resin side surface 634: Resin side surface
65: Recess R1, R2: Closed region
L12, L23, L31, L45, L56, L64: Line segment
L0, L9: Perpendicular bisector P1, P4: First vertex
P2, P5: Second vertex P3, P6: Third vertex

The invention claimed is:

1. A semiconductor device comprising:
a plurality of first semiconductor elements each having a first element obverse surface and a first element reverse surface that are spaced apart from each other in a thickness direction, the plurality of first semiconductor elements being electrically connected to each other in parallel;
a pad portion electrically connected to the plurality of first semiconductor elements; and
a first terminal portion electrically connected to the pad portion,
wherein as viewed in the thickness direction, the plurality of first semiconductor elements are aligned along a first direction perpendicular to the thickness direction,
the pad portion includes a closed region surrounded by three line segments that are each formed by connecting two of a first vertex, a second vertex, and a third vertex that are not on the same straight line,
as viewed in the thickness direction, the first vertex overlaps with one of the plurality of first semiconductor elements that is located in an outermost position in a first sense of the first direction,
as viewed in the thickness direction, the second vertex overlaps with one of the plurality of first semiconductor elements that is located in an outermost position in a second sense of the first direction,
as viewed in the thickness direction, the third vertex is located on a perpendicular bisector of the line segment connecting the first vertex and the second vertex,
the semiconductor device further comprises a joining portion connecting the pad portion and the first terminal portion, wherein the joining portion includes a first portion that is in contact with the pad portion, and the first portion overlaps with the perpendicular bisector as viewed in the thickness direction,
the first portion has a pair of edges that are spaced apart from each other in the first direction and extend along a second direction perpendicular to the thickness direction and the first direction, and
the pair of edges connect to the pad portion as viewed in the thickness direction.

2. The semiconductor device according to claim 1, wherein each of the pad portion and the first portion has a rectangular shape as viewed in the thickness direction, and
the first portion is smaller than the pad portion in the first direction.

3. The semiconductor device according to claim 1,
wherein the plurality of first semiconductor elements include two inner elements that are located between the first semiconductor element overlapping with the first vertex as viewed in the thickness direction and the first semiconductor element overlapping with the second vertex as viewed in the thickness direction, the two inner elements being adjacent to each other with the perpendicular bisector therebetween, and
the pair of edges are positioned on the two inner elements, respectively, as viewed in the second direction.

4. The semiconductor device according to claim 1, wherein a portion of each of the plurality of first semiconductor elements does not overlap with the pad portion as viewed in the thickness direction.

5. The semiconductor device according to claim 1,
wherein each of the plurality of first semiconductor elements includes a first obverse surface electrode formed on the first element obverse surface, and a first reverse surface electrode formed on the first element reverse surface, and
the pad portion is positioned on the first element obverse surfaces as viewed in the thickness direction, and is electrically connected to the first obverse surface electrodes of the plurality of first semiconductor elements.

6. The semiconductor device according to claim 5, further comprising a first conductive member on which the plurality of first semiconductor elements are mounted,
wherein the first reverse surface electrodes of the plurality of first semiconductor elements are bonded to the first conductive member.

7. The semiconductor device according to claim 6, wherein the pad portion, the first terminal portion, and the joining portion each have a plate-like shape and are formed integrally.

8. The semiconductor device according to claim 7, further comprising a plurality of second semiconductor elements each having a second element obverse surface and a second element reverse surface that are spaced apart from each other in the thickness direction, the plurality of second semiconductor elements being electrically connected to each other in parallel,
wherein the plurality of first semiconductor elements and the plurality of second semiconductor elements are electrically connected to each other in series.

9. The semiconductor device according to claim 8, further comprising a second conductive member on which the plurality of second semiconductor elements are mounted,
wherein the first conductive member and the second conductive member are spaced apart and aligned in the second direction.

10. The semiconductor device according to claim 9, wherein each of the plurality of second semiconductor elements includes a second obverse surface electrode formed on the second element obverse surface, and a second reverse surface electrode formed on the second element reverse surface.

11. The semiconductor device according to claim 10, wherein the second reverse surface electrodes of the plurality of second semiconductor elements are bonded to the second conductive member.

12. The semiconductor device according to claim 11, further comprising a plurality of connecting members electrically connecting the first conductive member and the second obverse surface electrodes of the plurality of second semiconductor elements.

13. The semiconductor device according to claim 12, further comprising:
  a second terminal portion electrically connected to the second conductive member; and
  a third terminal portion electrically connected to the first conductive member.

14. The semiconductor device according to claim 13, wherein the pad portion extends across the first conductive member and the second conductive member as viewed in the thickness direction.

15. The semiconductor device according to claim 14,
  wherein the first vertex and the second vertex overlap with the first conductive member as viewed in the thickness direction, and
  the third vertex overlaps with the second conductive member as viewed in the thickness direction.

16. The semiconductor device according to claim 14, wherein the second terminal portion is aligned with the first terminal portion in the first direction, and overlaps with the first terminal portion as viewed in the first direction.

17. The semiconductor device according to claim 13, further comprising a resin member covering the plurality of first semiconductor elements and the plurality of second semiconductor elements, wherein the first terminal portion, the second terminal portion, and the third terminal portion are exposed from the resin member.

18. The semiconductor device according to claim 10, wherein each of the plurality of first semiconductor elements further includes a first control electrode insulated from the first obverse surface electrode and formed on the first element obverse surface, where the first obverse surface electrode and the first reverse surface electrode are electrically connected to each other according to a first drive signal inputted to the first control electrode, and each of the plurality of second semiconductor elements further includes a second control electrode insulated from the second obverse surface electrode and formed on the second element obverse surface, where the second obverse surface electrode and the second reverse surface electrode are electrically connected to each other according to a second drive signal inputted to the second control electrode.

\* \* \* \* \*